US009728643B2

United States Patent
Park et al.

(10) Patent No.: US 9,728,643 B2
(45) Date of Patent: Aug. 8, 2017

(54) SEMICONDUCTOR DEVICES HAVING A SPACER ON AN ISOLATION REGION

(71) Applicants: Byungjae Park, Seongnam-si (KR); Heonjong Shin, Yongin-si (KR); Hagju Cho, Seongnam-si (KR); Kyounghwan Yeo, Seoul (KR)

(72) Inventors: Byungjae Park, Seongnam-si (KR); Heonjong Shin, Yongin-si (KR); Hagju Cho, Seongnam-si (KR); Kyounghwan Yeo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/974,018

(22) Filed: Dec. 18, 2015

(65) Prior Publication Data

US 2016/0293749 A1   Oct. 6, 2016

(30) Foreign Application Priority Data

Apr. 1, 2015  (KR) ........................ 10-2015-0046420

(51) Int. Cl.
    *H01L 29/78*      (2006.01)
    *H01L 29/06*      (2006.01)
    *H01L 29/417*     (2006.01)
    *H01L 29/66*      (2006.01)

(52) U.S. Cl.
     CPC ........ *H01L 29/785* (2013.01); *H01L 29/0649* (2013.01); *H01L 29/41791* (2013.01); *H01L 29/66545* (2013.01)

(58) Field of Classification Search
     CPC ............... H01L 29/785; H01L 29/7851; H01L 29/7853–29/7858; H01L 29/513
     See application file for complete search history.

(56) References Cited

U.S. PATENT DOCUMENTS

| | | | |
|---|---|---|---|
| 7,141,856 B2 | 11/2006 | Lee et al. | |
| 7,534,686 B2 | 5/2009 | Lee et al. | |
| 8,426,923 B2* | 4/2013 | Lee | H01L 21/823431 |
| | | | 257/365 |
| 2011/0147839 A1* | 6/2011 | Yagishita | H01L 21/823431 |
| | | | 257/347 |
| 2011/0210393 A1 | 9/2011 | Chen et al. | |
| 2014/0217517 A1 | 8/2014 | Cai et al. | |
| 2014/0239396 A1* | 8/2014 | Liu | H01L 21/28008 |
| | | | 257/347 |
| 2014/0264607 A1 | 9/2014 | Basu et al. | |

FOREIGN PATENT DOCUMENTS

KR        10-0496891 B1       6/2005

* cited by examiner

*Primary Examiner* — Daniel Shook
(74) *Attorney, Agent, or Firm* — Harness, Dickey & Pierce, P.L.C.

(57) ABSTRACT

A semiconductor device including a fin active region protruding from a substrate and an isolation region defining the fin active region, a gate pattern intersecting the fin active region and the isolation region, and gate spacer formed on a side surface of the gate pattern and extending onto a surface of the isolation region is provided.

19 Claims, 26 Drawing Sheets

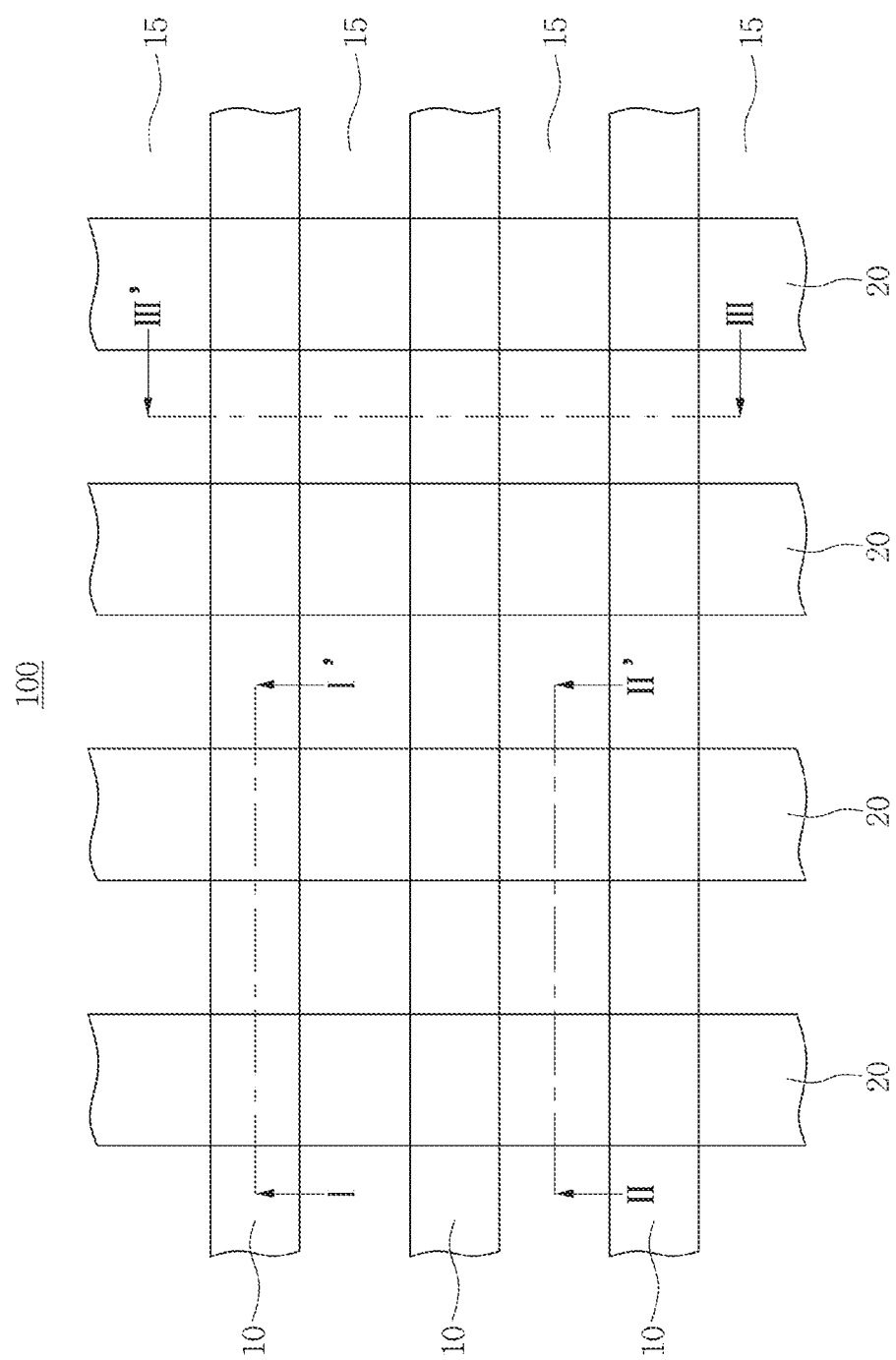

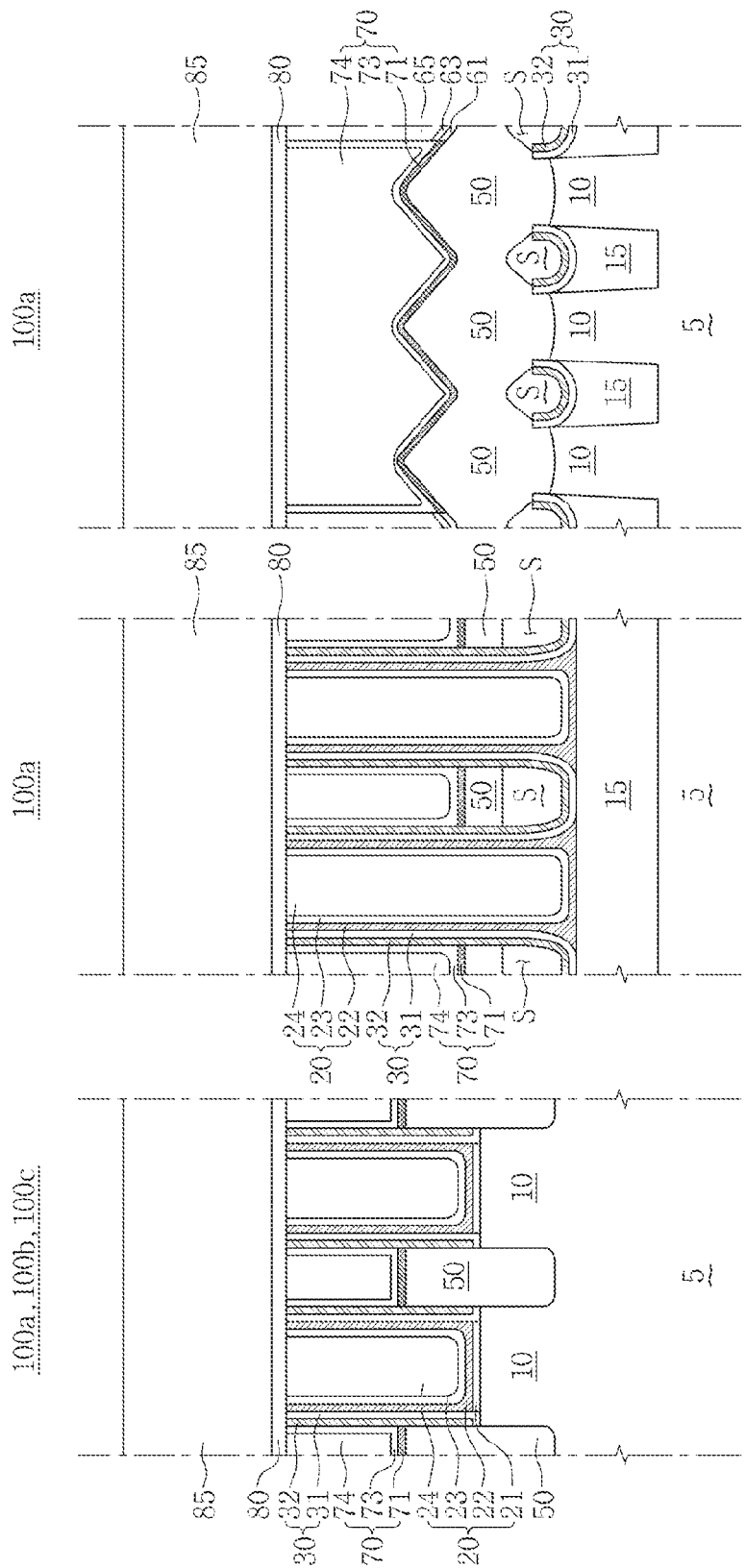

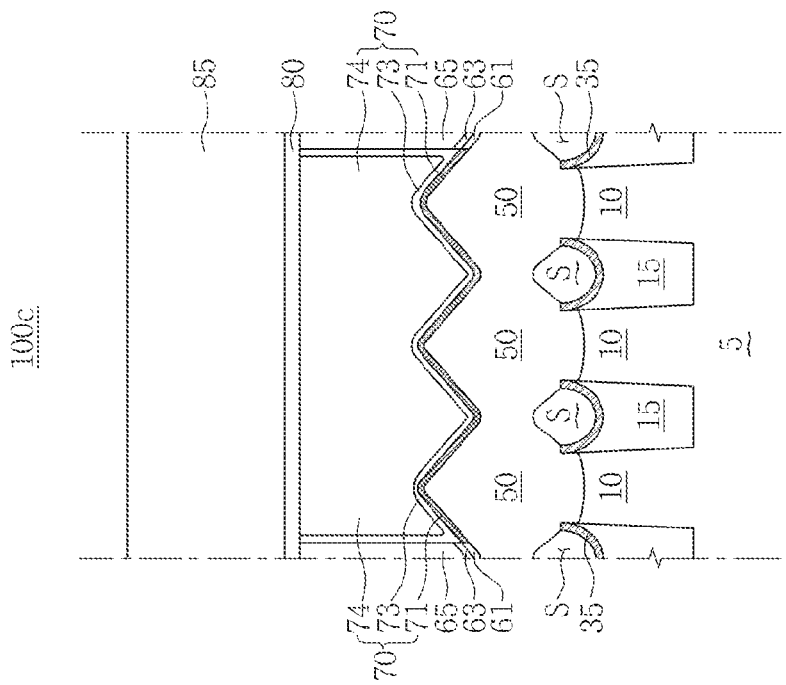
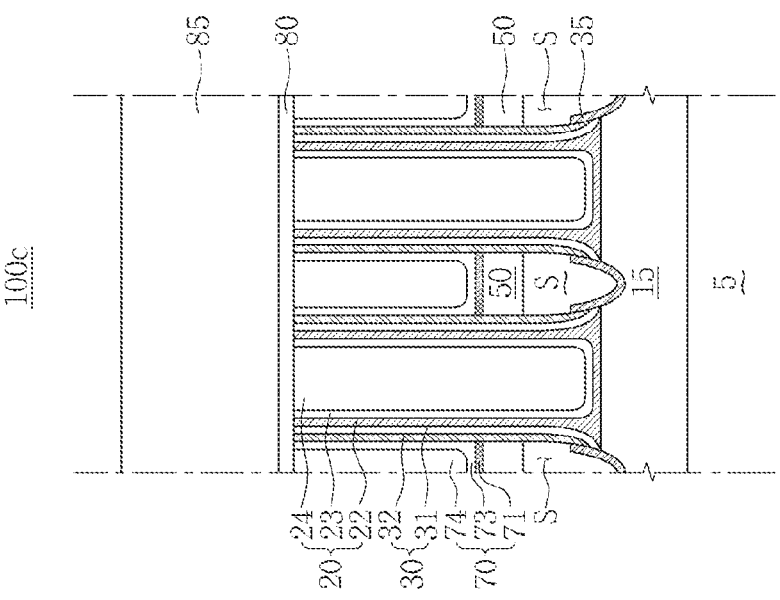

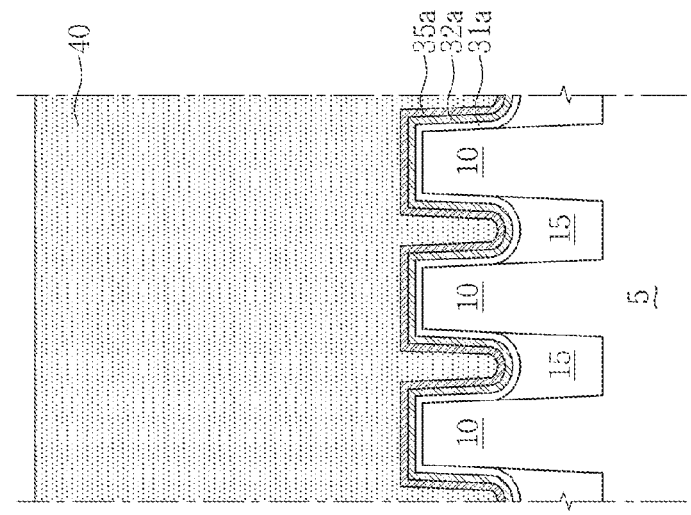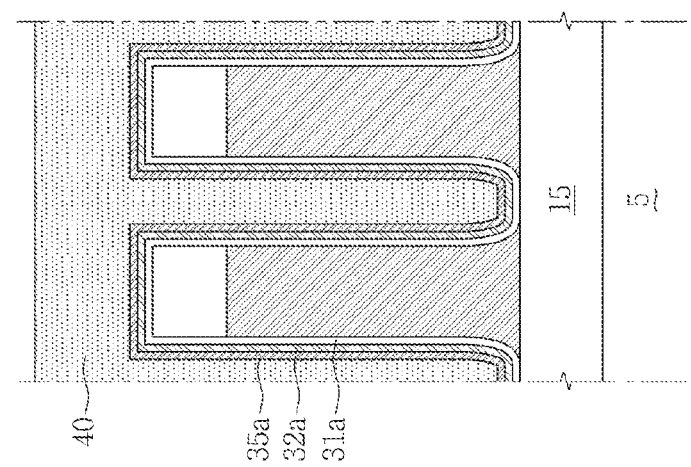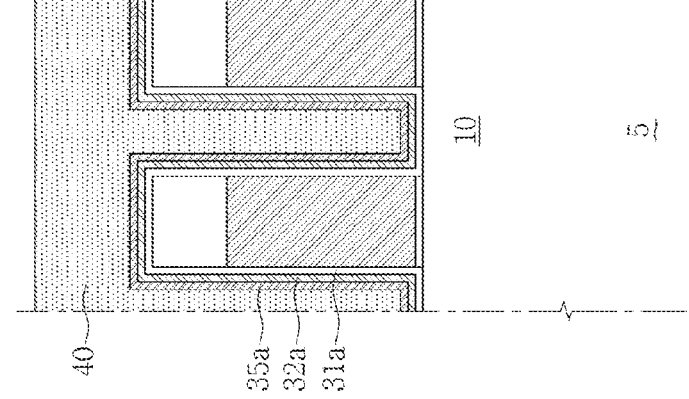

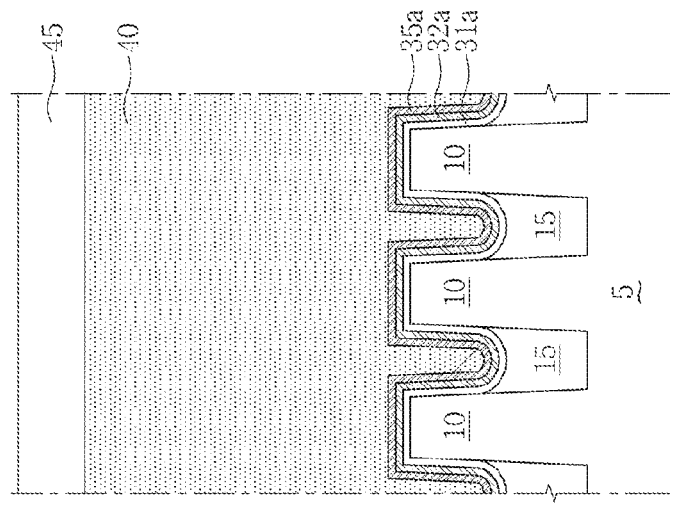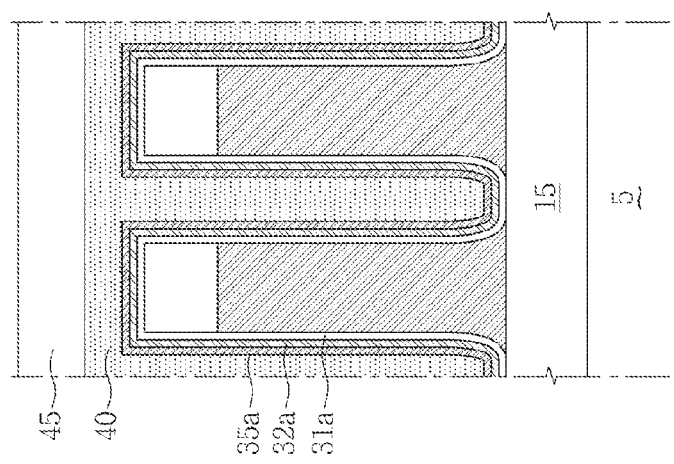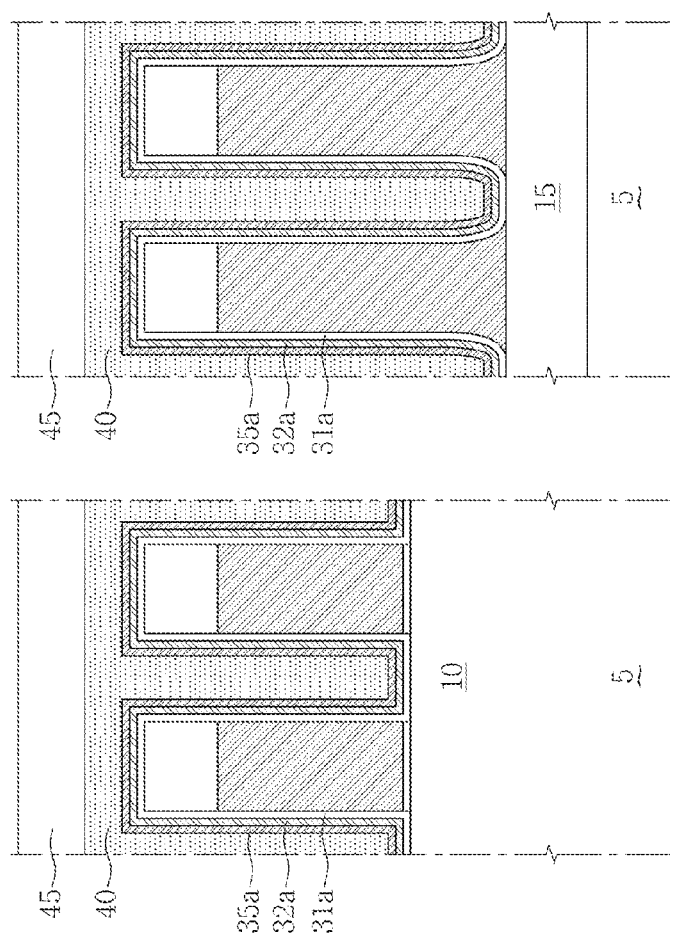

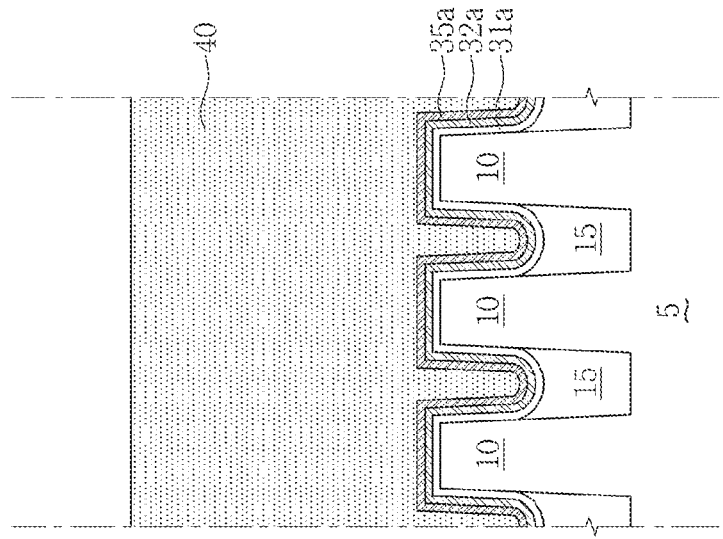
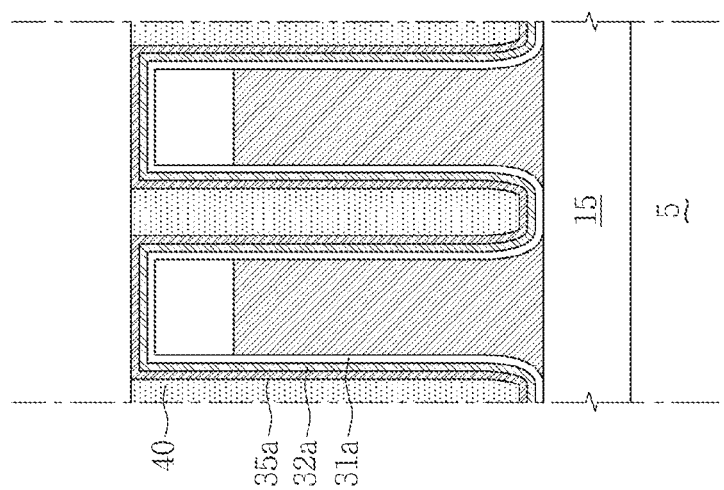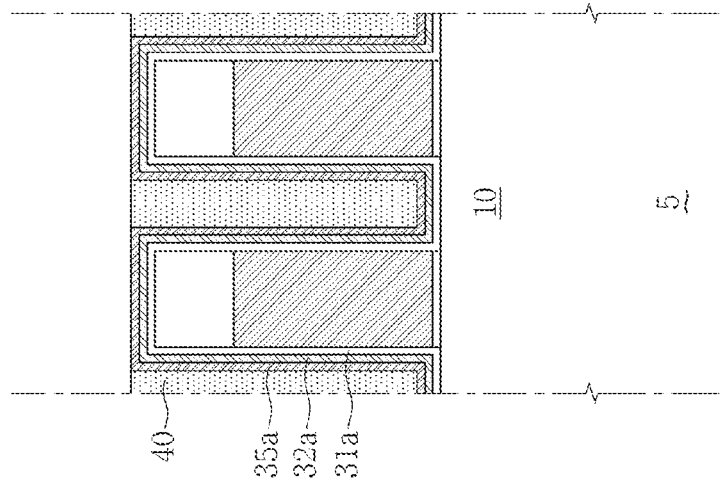

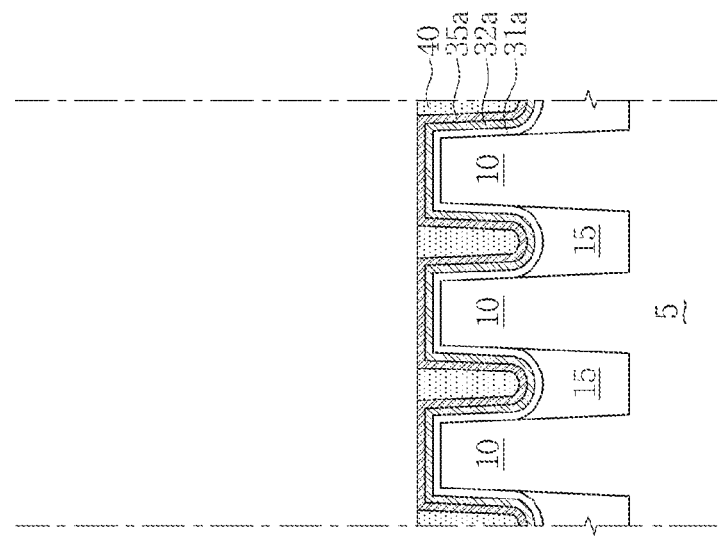
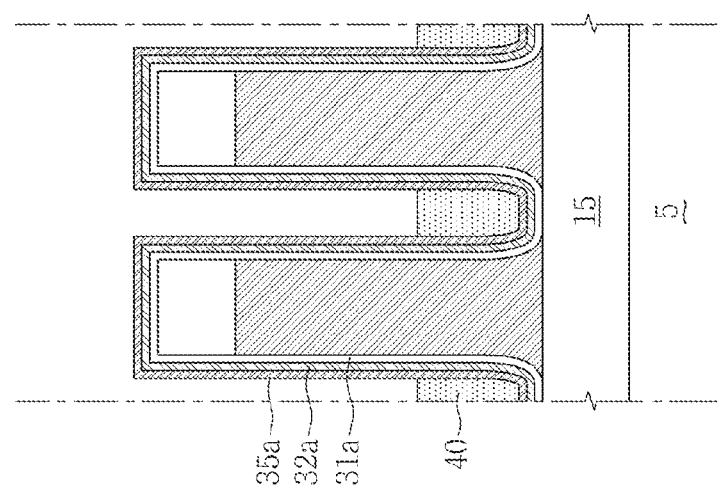
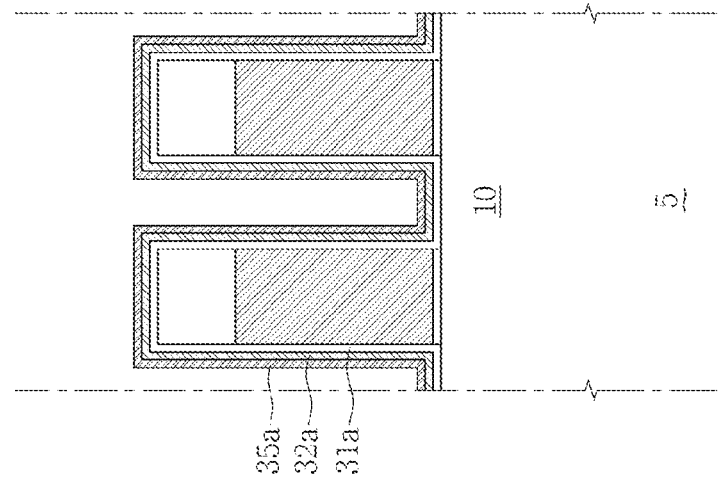

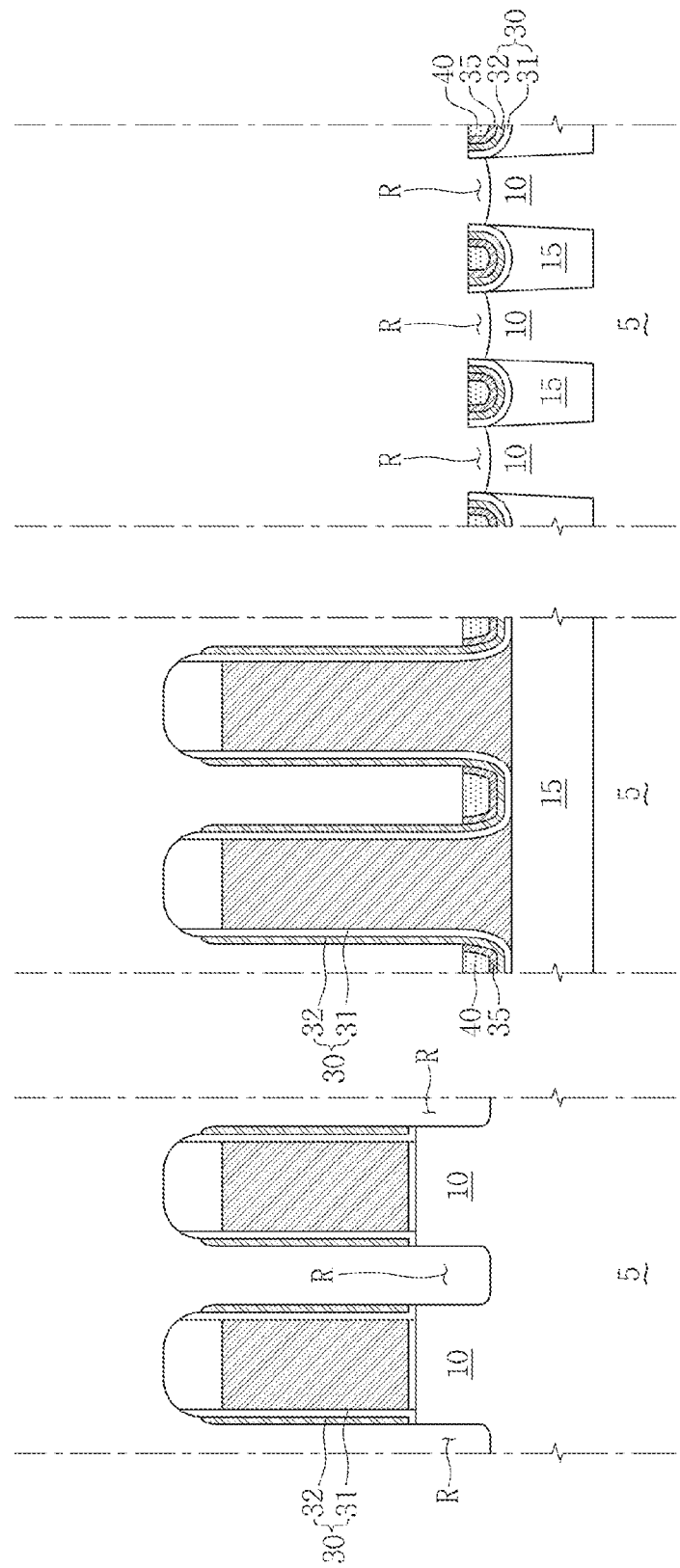

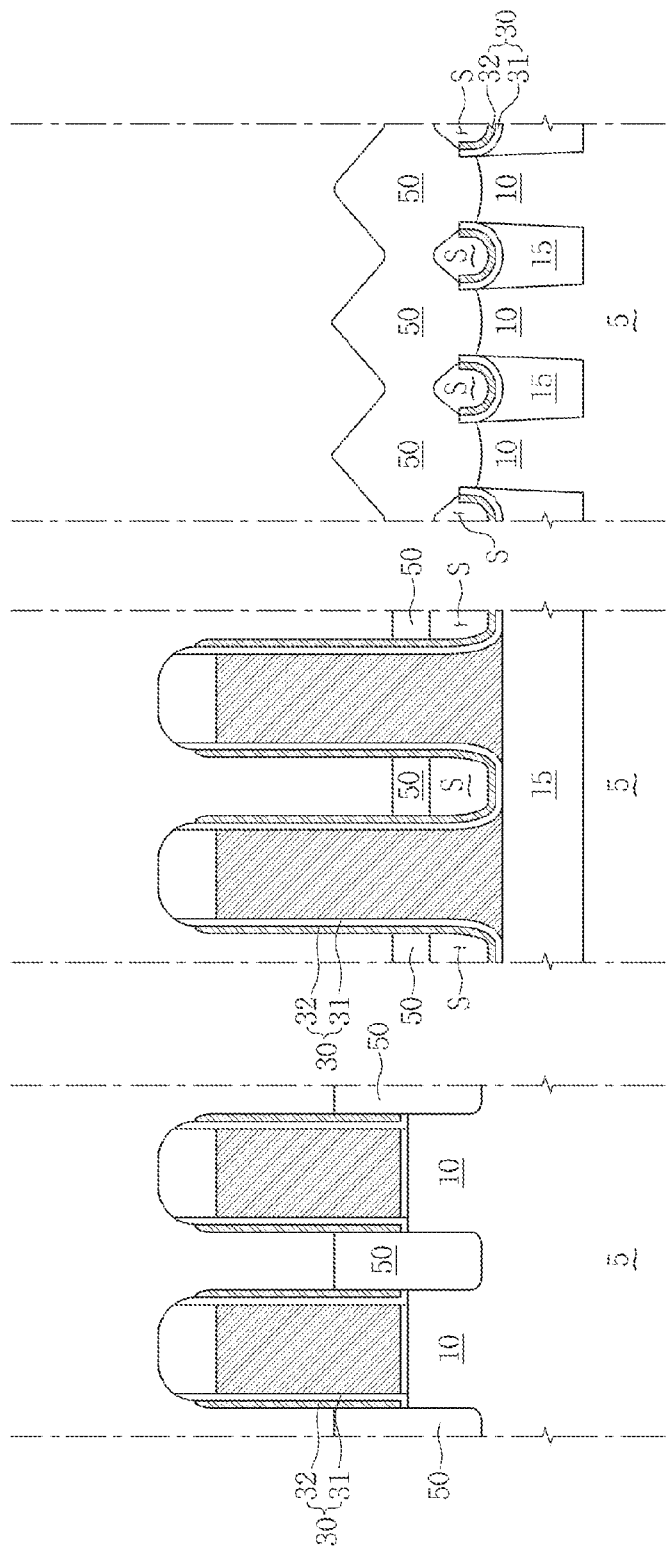

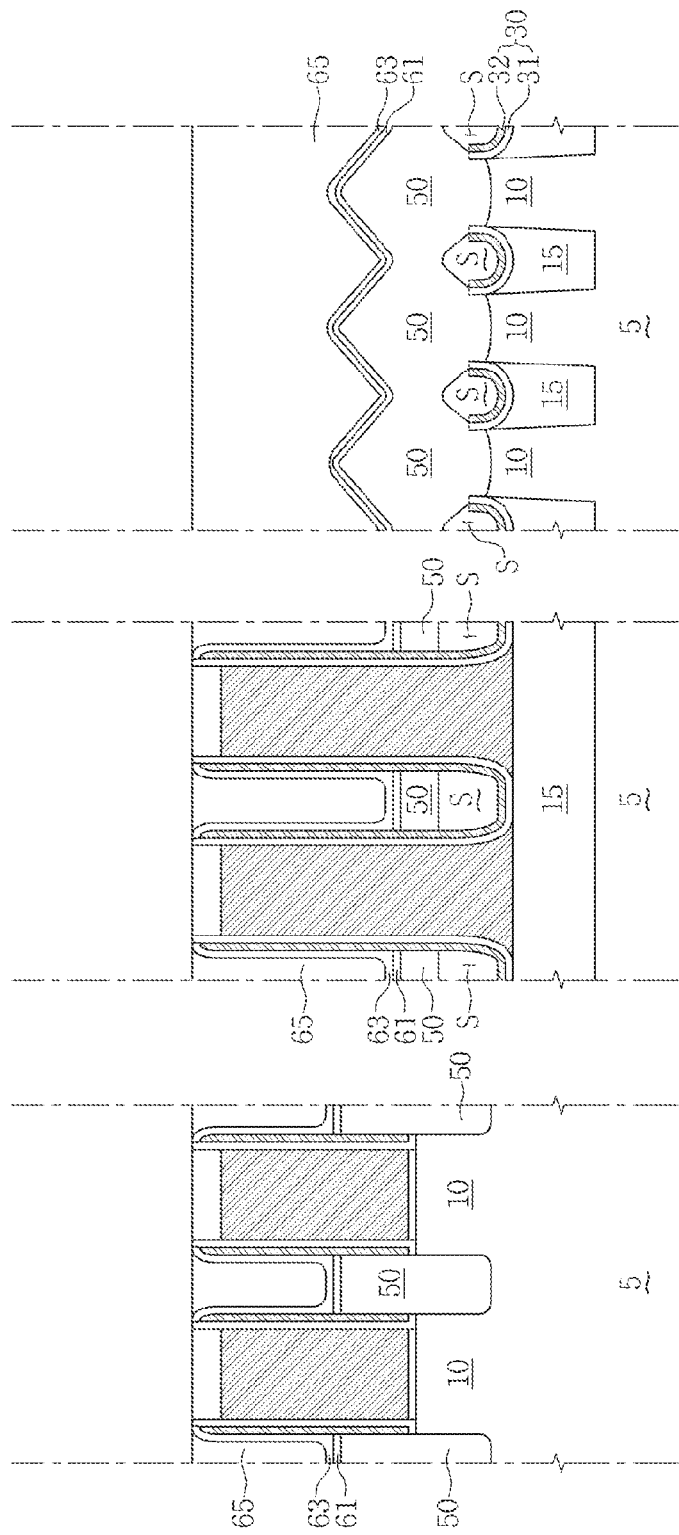

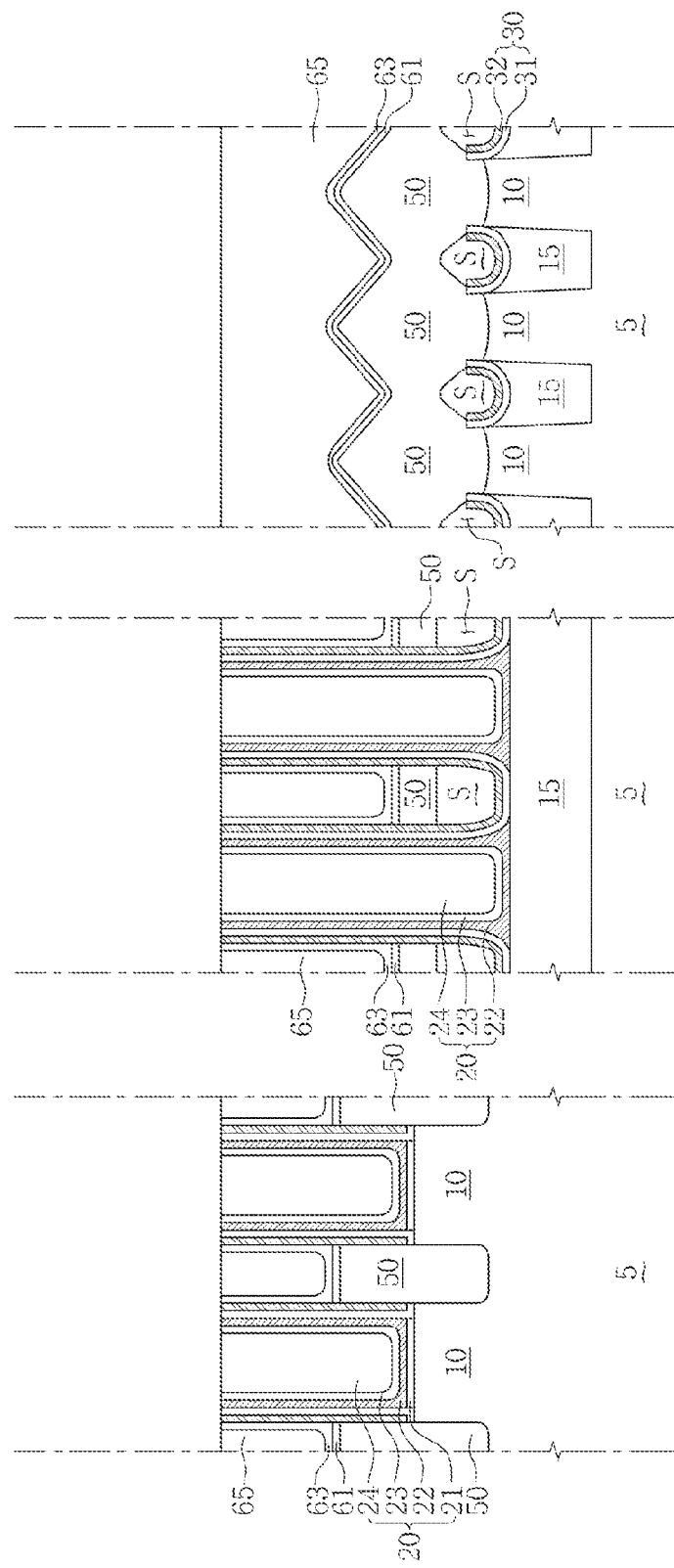

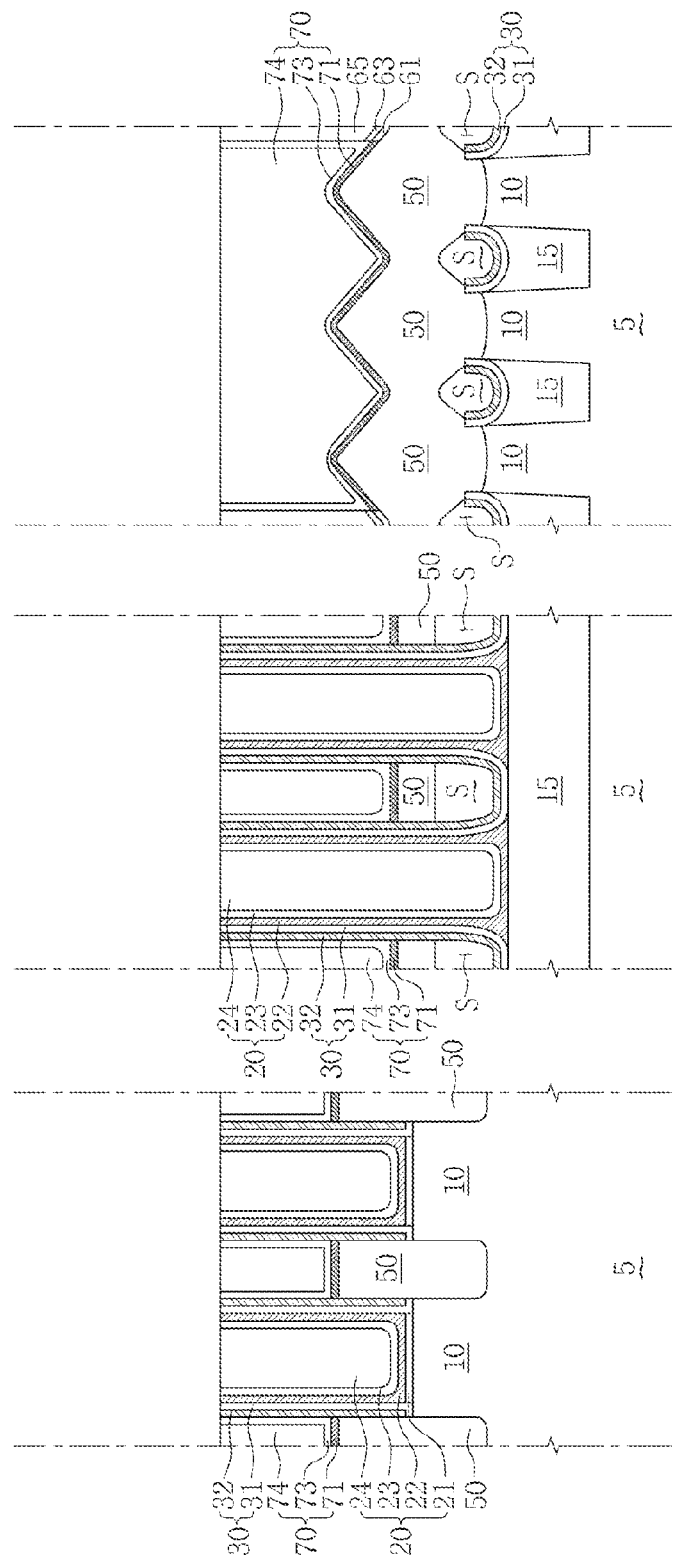

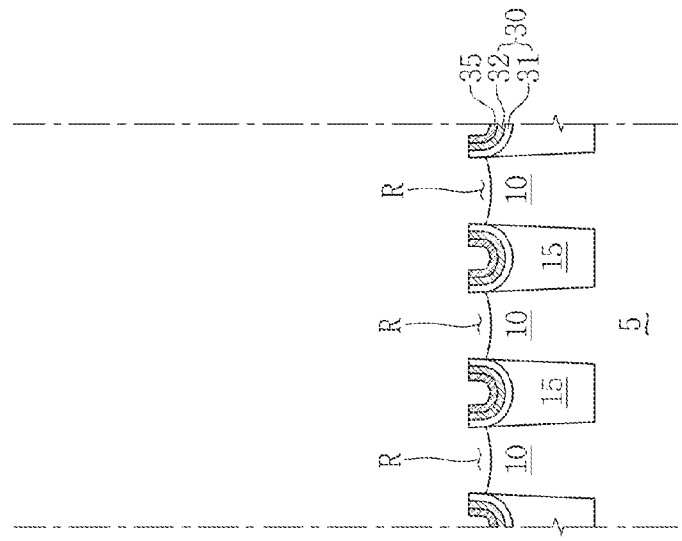
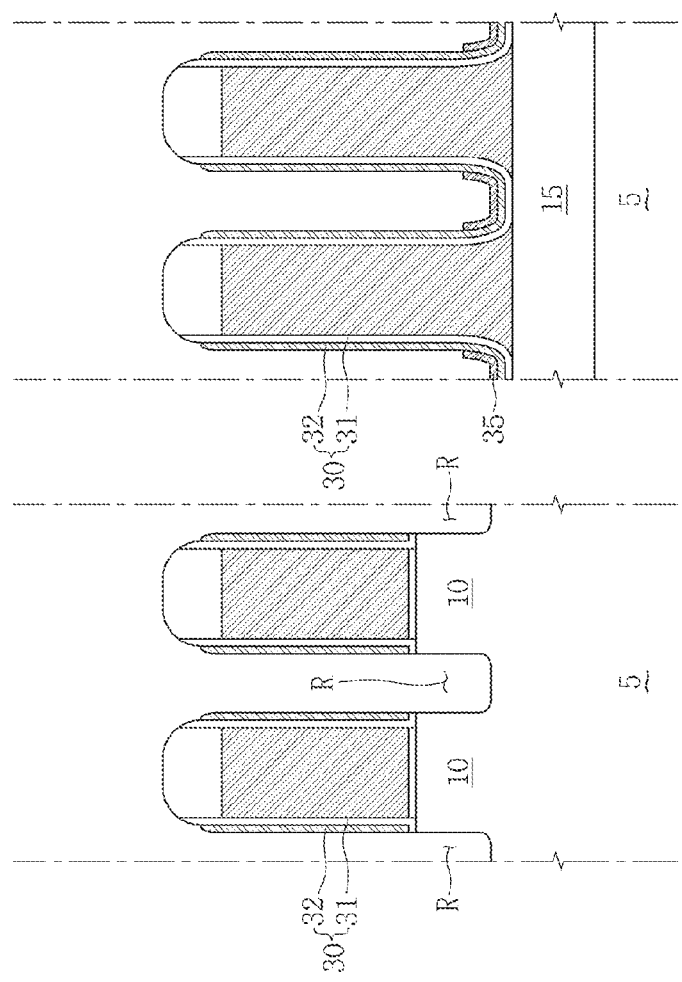

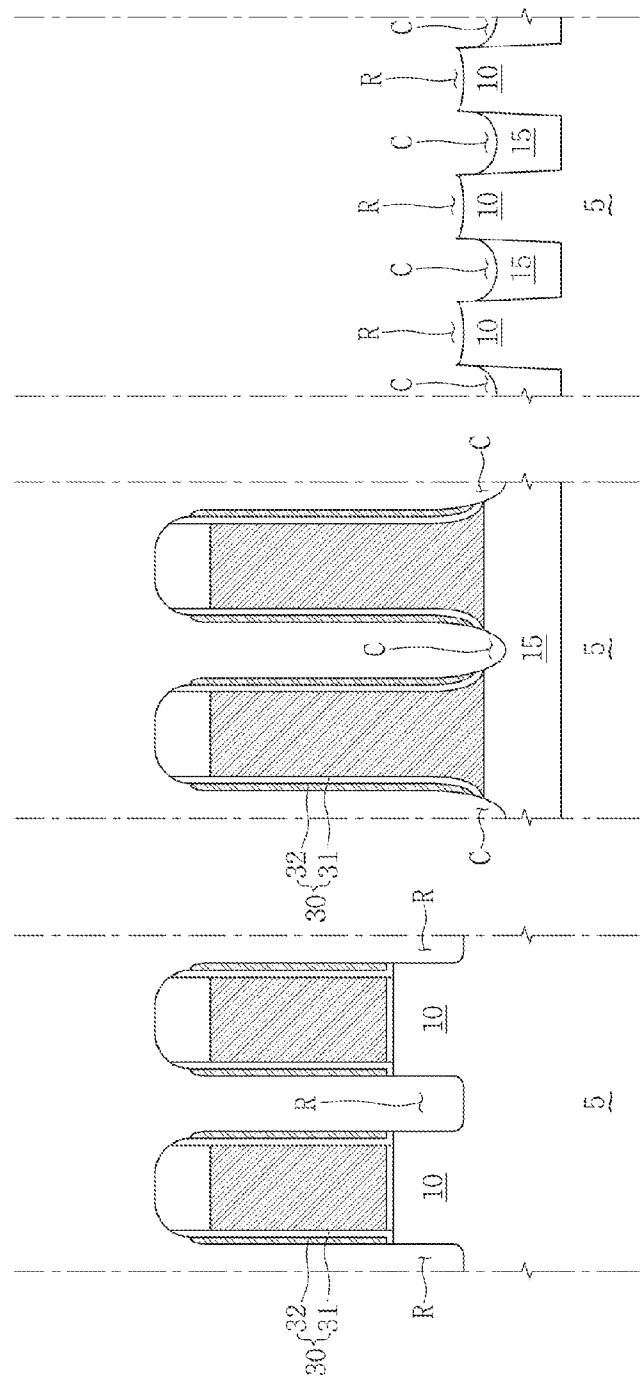

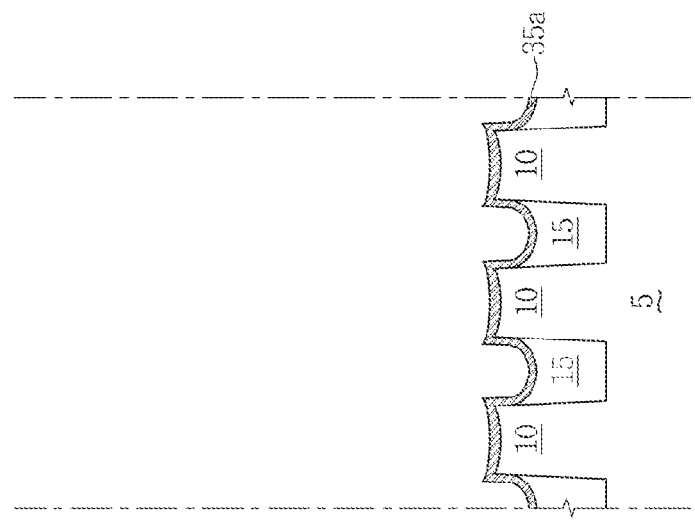
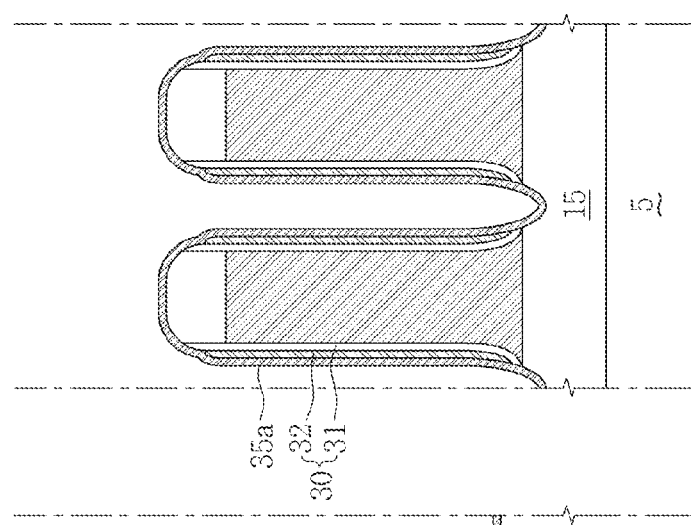
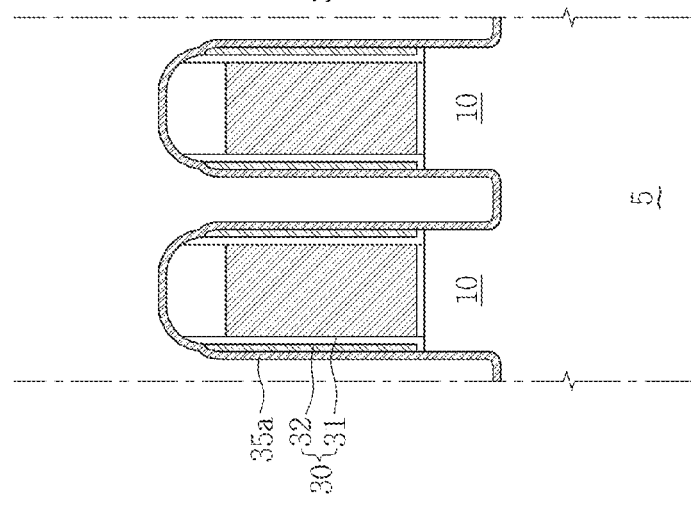

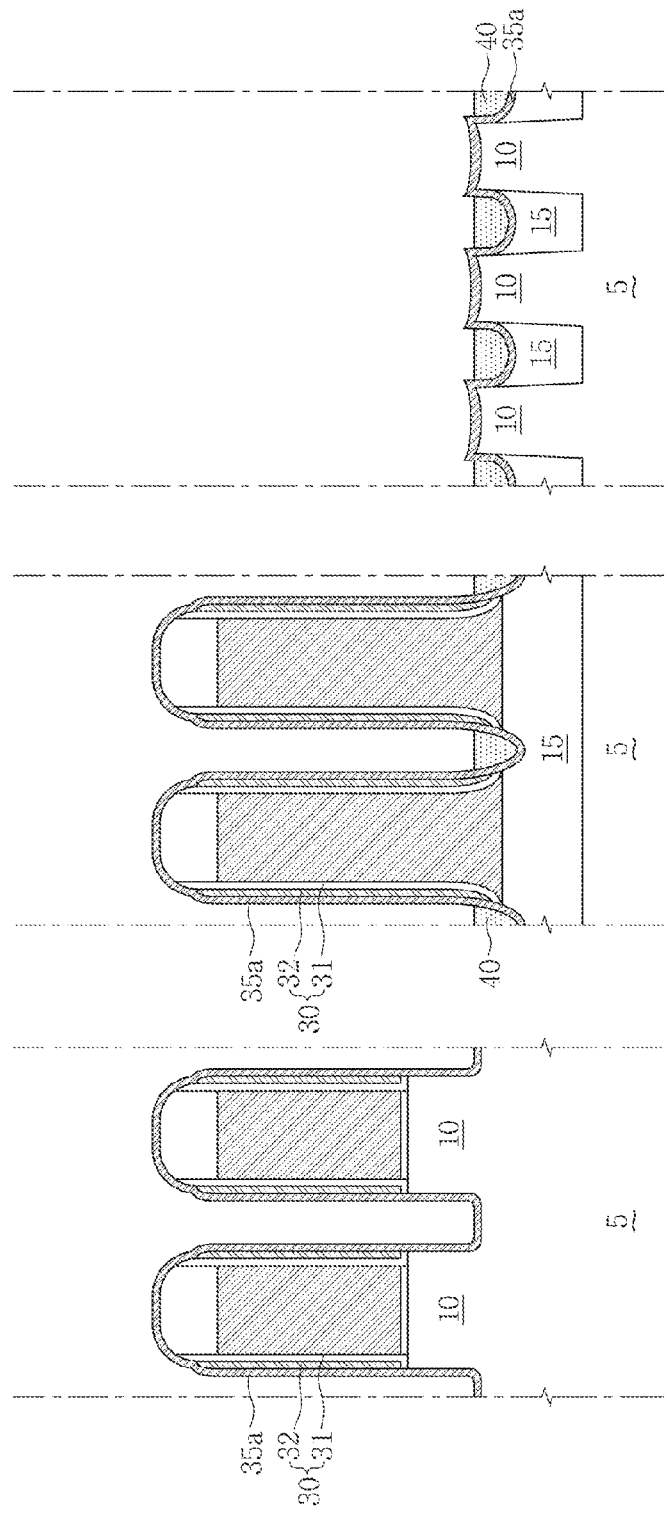

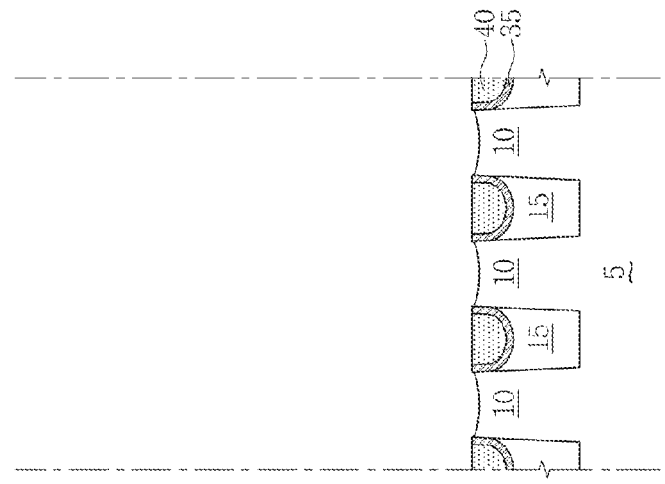
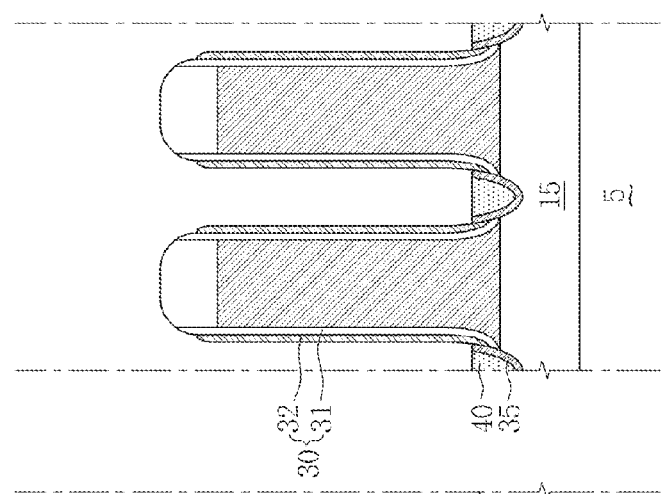
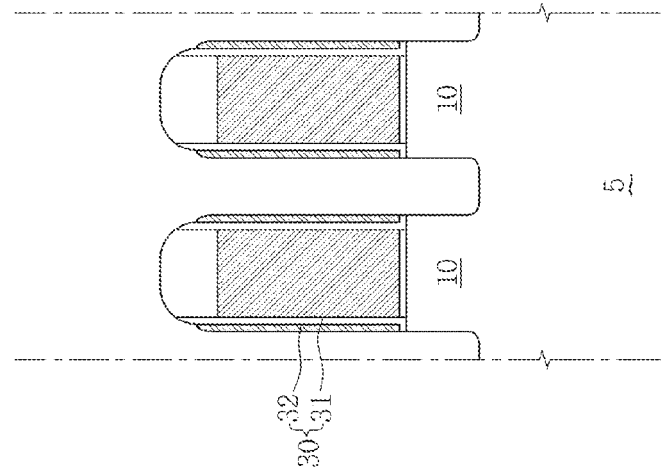

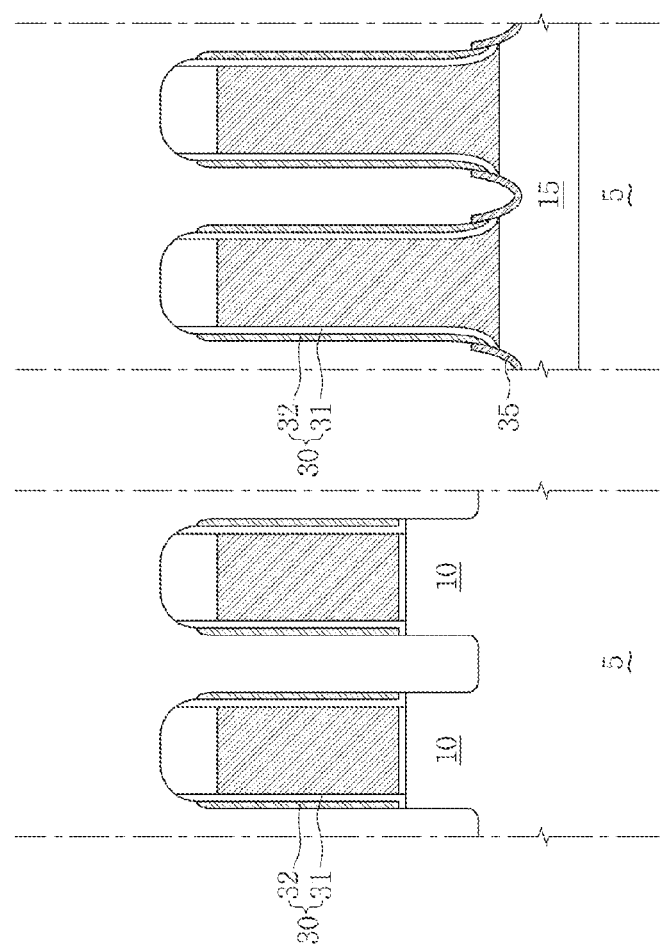

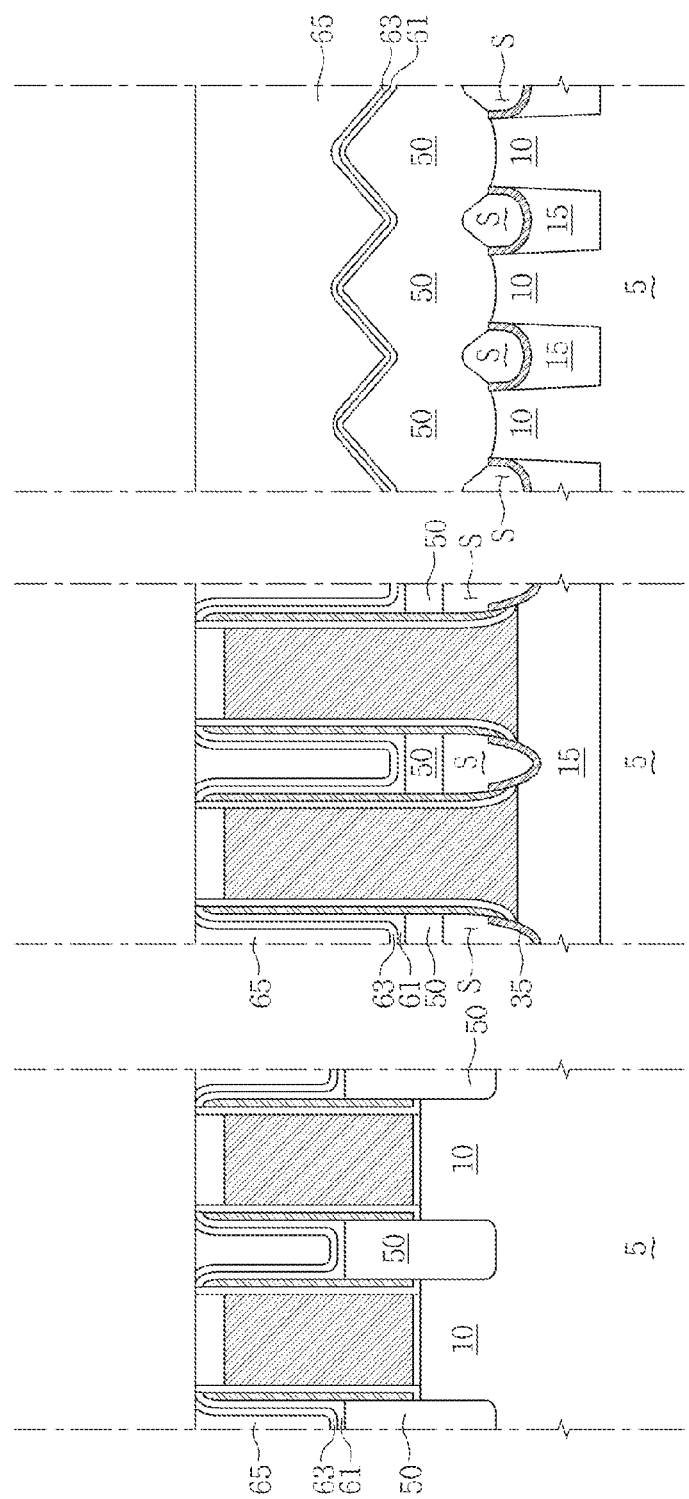

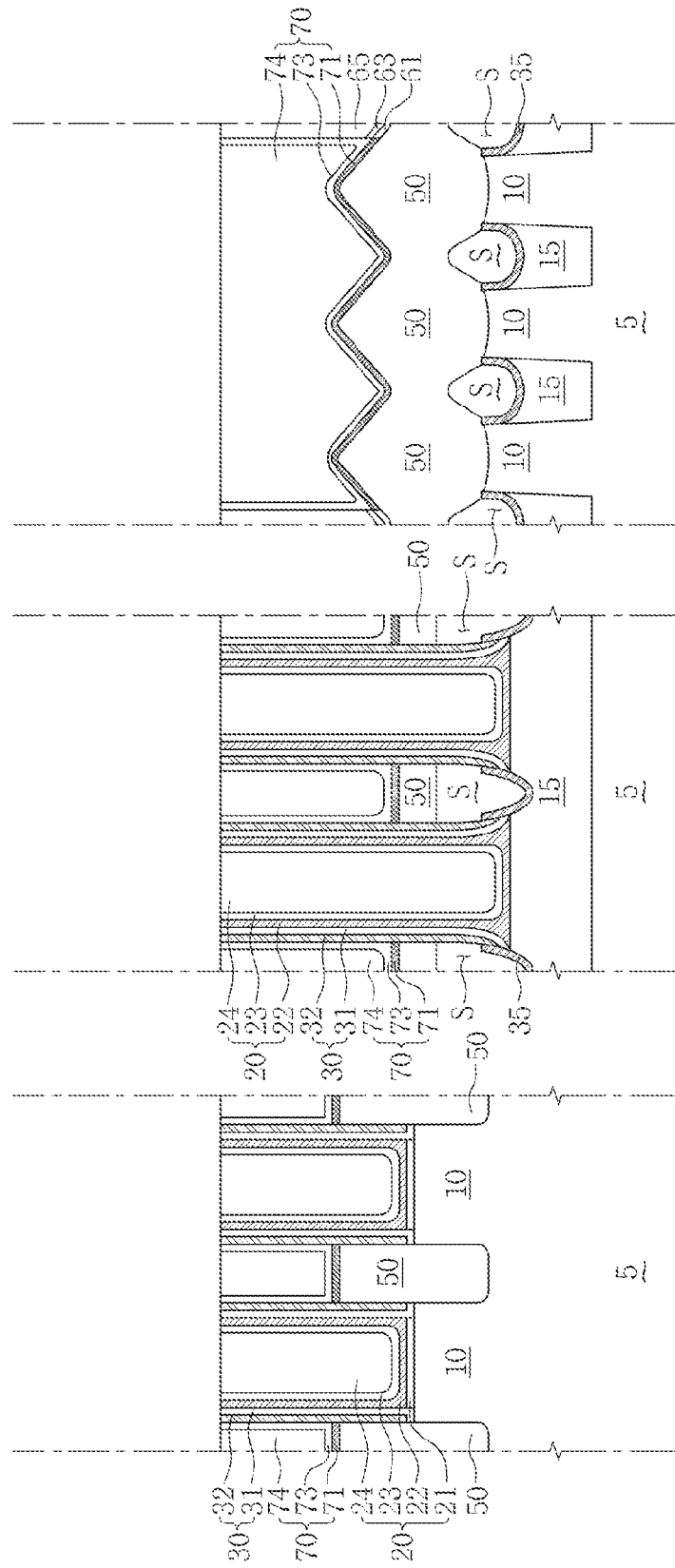

SEMICONDUCTOR DEVICES HAVING A SPACER ON AN ISOLATION REGION

CROSS-REFERENCE TO RELATED APPLICATION

This application claims priority under 35 U.S.C. §119 to Korean Patent Application No. 10-2015-0046420 filed on Apr. 1, 2015, the disclosure of which is hereby incorporated by reference in its entirety.

BACKGROUND

Technical Field

Example embodiments of the inventive concepts provide semiconductor devices having a spacer on an isolation region.

Description of Related Art

As semiconductor devices having protruding fin active regions with a 3D structure have been researched and developed, a leakage current can be generated by step differences between the fin active regions with a 3D structure and isolation regions. For example, the leakage current may be generated between gate patterns extending onto the fin active regions with a 3D structure and the isolation regions and source/drain regions in the fin active regions with a 3D structure.

SUMMARY

The inventive concepts suggest methods for blocking the leakage current paths between the gate patterns and the source/drain regions in the semiconductor device having the fin active regions with a 3D structure.

The technical objectives and example embodiments of the inventive concepts are not limited to the above disclosure; other objectives and example embodiments may become apparent to those of ordinary skill in the art based on the following descriptions.

In accordance with one example embodiment of the inventive concepts, a semiconductor device includes a fin active region protruding from a substrate and an isolation region defining the fin active region, a gate pattern intersecting the fin active region and the isolation region, and gate spacer formed on a side surface of the gate pattern and extending onto a surface of the isolation region.

The gate spacer may include an inner spacer having an etch selectivity with respect to the isolation region and an outer spacer having an etch selectivity with respect to the isolation region and the inner spacer.

The semiconductor device may further include a source/drain region protruding from an inside of the fin active region beside the gate pattern.

The protruding portion of the source/drain region may expand horizontally.

The semiconductor device may further include an air space formed between the outer spacer on the isolation region and the expanded portion of the source/drain region.

The gate spacer on the isolation region may have a U-shaped sectional view.

The semiconductor device may further include a capping spacer on the gate spacer on the isolation region.

The capping spacer may have a concave bowl shape.

The gate pattern on the fin active region may include an interface insulating layer directly on the fin active region, a gate insulating layer on the interface insulating layer, a gate barrier layer on the gate insulating layer, and a gate electrode on the gate barrier layer.

The gate pattern on the isolation region may include a gate insulating layer directly on the isolation region, a gate barrier layer on the gate insulating layer, and a gate electrode on the gate barrier layer.

In accordance with example embodiments of the inventive concepts, a semiconductor device includes isolation regions defining fin active regions, gate patterns on the fin active regions and the isolation regions, and gate spacers on side walls of the gate patterns. The gate spacers extend onto the isolation regions between the fin active regions and have U-shaped sectional views.

The gate spacers may include inner spacers being in contact with the gate patterns and the isolation regions and including silicon nitride, and outer spacers including carbon to have an etch selectivity with respect to the inner spacers.

Each of the gate patterns may include a gate insulating layer directly on the isolation region, a gate barrier layer on the gate insulating layer, and a gate electrode on the gate barrier layer.

The gate patterns may further include interface insulating layers between the fin active regions and the gate insulating layers.

The semiconductor device may further include source/drain regions protruding from insides of the fin active regions between the gate patterns, and contact patterns on the source/drain regions. The source/drain regions are connected with each other in a bridge shape. Each of the contact patterns includes a silicide layer on the source/drain region, a contact barrier layer on the silicide layer, and a contact plug on the contact barrier layer.

In accordance with example embodiments of the inventive concepts, a semiconductor device includes fin active regions extending in a first direction and isolation regions between the fin active regions, gate patterns extending in a second direction perpendicular to the first direction to intersect the fin active regions and the isolation regions, gate spacers on sidewalls of the gate patterns, and source/drain regions in the fin active regions between the gate patterns. The gate spacers cover the isolation region between the gate patterns.

The gate spacers formed on the facing sidewalls of the adjacent gate patterns may be integrated to be materially contiguous.

The gate spacers may include inner spacers directly formed on the sidewalls of the gate patterns, and outer spacers formed on outer sidewalls of the inner spacers. The inner spacers may be in contact with the isolation regions and the source/drain regions.

The semiconductor device may further include capping spacers on the isolation regions between the gate patterns.

The capping spacers may have concave bowl shapes and may not be formed on the sidewalls of the gate patterns.

In accordance with example embodiments of the inventive concepts, a semiconductor device includes an isolation region and a fin active region protruding beyond a bottom surface of the isolation region, a gate pattern on the isolation region and the fin active region, a gate spacer on a sidewall of the gate pattern, and a capping spacer in the isolation region.

The capping spacer may have a concave bowl shape.

The capping spacer may be in contact with the isolation region.

The capping spacer may not be formed on the sidewall of the gate pattern.

The gate spacer may include an inner spacer and an outer spacer, and may extend onto the isolation region.

According to example embodiments, a semiconductor device comprises an isolation region and a fin active region protruding beyond a bottom surface of the isolation region, a gate pattern formed on the isolation region and the fin active region, a gate spacer formed on a sidewall of the gate pattern, and a capping spacer formed in the isolation region. Details of other example embodiments are included in detailed explanations and the drawings.

BRIEF DESCRIPTION OF THE DRAWINGS

The foregoing and other features and advantages of the inventive concepts will be apparent from the more particular description of preferred example embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings:

FIG. 1 illustrates a layout of a semiconductor device in accordance with example embodiments of the inventive concepts;

FIGS. 2, 3A and 3B, 4A and 4B, and 5A and 5B illustrate semiconductor devices in accordance with example embodiments of the inventive concepts. FIG. 2 illustrates a longitudinal sectional view taken along a line I-I' of FIG. 1, FIGS. 3A, 4A, and 5A illustrate longitudinal sectional views taken along a line II-II' of FIG. 1, and FIGS. 3B, 4B, and 5B illustrate longitudinal sectional views taken along a line III-III' of FIG. 1;

FIGS. 6A to 25C illustrate longitudinal sectional views for describing methods of fabricating semiconductor devices in accordance with example embodiments of the inventive concepts; FIGS. 6A to 25A illustrate longitudinal sectional views taken along the line I-I' of FIG. 1, FIGS. 6B to 25B illustrate longitudinal sectional views taken along the line II-II' of FIG. 1, and FIGS. 6C to 25C illustrate longitudinal sectional views taken along the line III-III' of FIG. 1;

DETAILED DESCRIPTION OF THE EMBODIMENTS

Figure 4A:
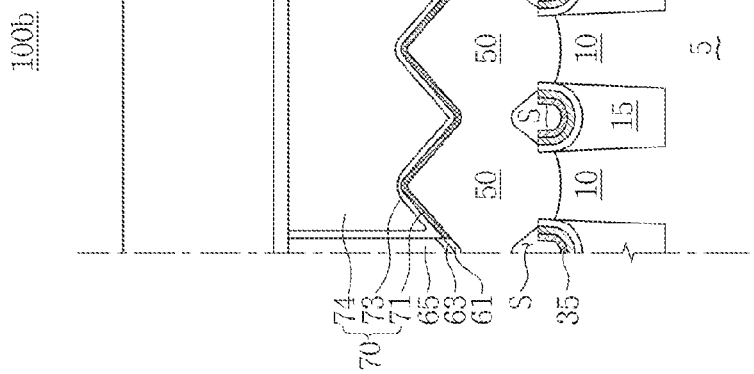

Various example embodiments will now be described more fully with reference to the accompanying drawings in which some example embodiments are shown. These inventive concepts may, however, be embodied in different forms and should not be construed as limited to the example embodiments set forth herein. Rather, these example embodiments are provided so that this disclosure is thorough and complete and fully conveys the inventive concepts to those skilled in the art.

The terminology used herein to describe example embodiments of the invention is not intended to limit the scope of the invention. The articles "a," "an," and "the" are singular in that they have a single referent; however, the use of the singular form in the present document should not preclude the presence of more than one referent. In other words, elements of the invention referred to in the singular form may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected to, or coupled to the other element or layer or intervening elements or layers may be present. In the following explanation, the same reference numerals denote the same components throughout the specification.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Example embodiments are described herein with reference to cross-sectional and/or plan illustrations that are schematic illustrations of idealized example embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the scope of the present inventive concepts.

Like numerals refer to like elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

FIG. 1 illustrates a layout of a semiconductor device 100 in accordance with example embodiments of the inventive concepts. Referring to FIG. 1, a semiconductor device 100 in accordance with example embodiments of the inventive concepts may include fin active regions 10 extending in parallel with each other in an X-direction, and gate patterns 20 extending in parallel with each other in an Y-direction perpendicular to the X-direction and intersecting the fin active regions 10. Isolation regions 15 defining the fin active regions 10 may be disposed between the fin active regions 10.

FIGS. 2, 3A and 3B, 4A and 4B, and 5A and 5B illustrate semiconductor devices 100a, 100b, and 100c in accordance with example embodiments of the inventive concepts. FIG. 2 illustrates a longitudinal sectional view taken along a ling I-I' of FIG. 1, FIGS. 3A, 4A, and 5A illustrate longitudinal sectional views taken along a line II-II' of FIG. 1, and FIGS. 3B, 4B, and 5B illustrate longitudinal sectional views taken along a line III-III' of FIG. 1.

Referring to FIGS. 2, 3A, and 3B, a semiconductor device 100a in accordance with example embodiments of the inventive concepts may include fin active regions 10 on a substrate 5, isolation regions 15, gate patterns 20, source/drain regions 50, and contact patterns 70.

The substrate 5 may include one of silicon wafer, silicon-on-insulator (SOI) wafer, or silicon germanium on silicon (SiGe on Si) wafer.

The fin active regions 10 may be portions of the substrate 5. For example, the fin active regions 10 may be the portions protruding from the substrate 5.

The isolation regions 15 may surround lower portions of the fin active regions 10 to define the fin active regions 10. Accordingly, the lower portions of the fin active regions 10 may be in contact with the isolation regions 15, and upper portions of the fin active regions 10 may protrude beyond bottom surfaces of the isolation region 15. The isolation regions 15 may include an insulating material such as silicon oxide ($SiO_2$).

The gate patterns 20 may perpendicularly intersect the fin active regions 10 and extend onto the surface of the isolation regions 15. The gate patterns 20 may include interface insulating layers 21, gate insulating layers 22, gate barrier layers 23, and gate electrodes 24.

The interface insulating layers 21 may be directly formed on the surfaces of the fin active layers 10. The interface insulating layers 21 may not be formed on the surfaces of the isolation regions 15. The interface insulating layers 21 may include one of a native oxide layer or an oxidized silicon layer formed by oxidizing the surfaces of the fin active regions 10. In other example embodiments, the interface insulating layers 21 may be omitted.

The gate insulating layers 22 may be formed on the interface insulating layers 21 or the fin active regions 10 to have a U-shaped sectional view. The gate insulating layers 22 may include at least one of hafnium oxide (HfO), aluminum oxide (AlO), titanium oxide (TiO), or another metal oxide.

The gate barrier layers 23 may be formed on bottom surfaces and inner walls of the gate insulating layers 22 to have a U-shaped sectional view. The gate barrier layers 23 may include at least one of titanium (Ti), titanium nitride (TiN), tantalum (Ta), tantalum nitride (TaN), or another barrier metal.

The gate electrodes 24 may be formed on bottom surfaces and inner walls of the gate barrier layers 23 to be surrounded by the gate barrier layers 23. The gate electrodes 24 may include at least one of tungsten (W), copper (Cu), titanium (Ti), or another single layered or multi layered metal compound.

The source/drain regions 50 may be formed in the fin active regions 10 between the gate patterns 20. The source/drain regions 50 may protrude from the surfaces of the fin active regions 10. The source/drain regions 50 may include at least one of epitaxially grown silicon (Si), silicon germanium (SiGe), and silicon carbide (SiC). The source/drain regions 50 may include at least one of phosphorous (P), arsenic (As), or boron (B).

The contact patterns 70 may be formed on the source/drain regions 50. For example, the contact patterns 70 may be formed on the source/drain regions 50 connected with each other in a bridge shape. Accordingly, one of the contact patterns 70 may be connected with a plurality of the source/drain regions 50.

The contact patterns 70 may include silicide layers 71, contact barrier layers 73, and contact plugs 74.

The silicide layers 71 may be directly formed on the source/drain regions 50. The silicide layers 71 may include at least one of tungsten silicide (WSi), nickel silicide (NiSi), titanium silicide (TiSi), cobalt silicide (CoSi), or another metal silicide.

The contact barrier layers 73 may be formed on the silicide layers 71 to have a U-shaped sectional view. The contact barrier layers 73 may include at least one of titanium (Ti), titanium nitride (TiN), tantalum (Ta), tantalum nitride (TaN), or another barrier metal or metal compound.

The contact plugs 74 may be formed on bottom surfaces and inner walls of the contact barrier layers 73 to be surrounded by the contact barrier layers 73. The contact plugs 74 may include at least one of tungsten (W), copper (Cu), titanium (Ti), and another metal or metal compound.

The semiconductor device 100a may further include gate spacers 30 formed on outer walls of the gate patterns 20. The gate spacers 30 may include inner spacers 31 and outer spacers 32.

The inner spacers 31 may be directly formed on sidewalls of the gate patterns 20. For example, the inner spacers 31 may be in contact with the sidewalls of the gate patterns 20. The inner spacers 31 may extend onto the surfaces of the isolation regions 15 to be in contact with the surfaces of the isolation regions 15. For example, the inner spacers 31 may cover the fin active regions 10 and the isolation regions 15 between the gate patterns 20. The inner spacers 31 may include a different material from the isolation regions 15 to have an etch selectivity with respect to the isolation region 15. The inner spacers 31 may include silicon nitride (SiN).

The outer spacers 32 may be formed on outer walls of the inner spacers 31. Accordingly, the outer spacers 32 may also cover the fin active regions 10 and the isolation regions 15 between the gate patterns 20. The outer spacers 32 may include a different material from the inner spacers 31 to have an etch selectivity with respect to the inner spacers 31. For example, the outer spacers 32 may include carbon-containing silicon oxide (SiCO).

Uppermost surfaces of the gate patterns 20, the contact patterns 70, the inner spacers 31, and the outer spacers 32 may be coplanar.

The inner spacers 31 and the outer spacers 32 may extend onto the surfaces of the isolation regions 15 between the fin active regions 10. The inner spacers 31 and the outer spacers 32 formed on the isolation regions 15 may have a U-shaped sectional view. The inner spacers 31 and the outer spacers 32 on sidewalls of the adjacent gate patterns 20 facing each other may be integrated to be materially continuous with each other.

Air spaces S may be formed between the outer spacers 32 on the isolation regions 15 and the source/drain regions 50.

The inner spacers 31 may be in contact with the surfaces of the isolation regions 15 and sidewalls of lower portions of the source/drain regions 50.

The semiconductor device 100a may further include an oxide layer 61, a stopper layer 63, and a lower interlayer insulating layer 65 on the fin active regions 10. The oxide layer 61 may be directly formed on the surfaces of the source/drain regions 50. The oxide layer 61 may include at least one of silicon oxide or a compound containing oxidized silicon. The stopper layer 63 may be directly formed on the oxide layer 61. The stopper layer 63 may include silicon nitride (SiN). The lower interlayer insulating layer 65 may include a compound containing oxidized silicon such as tetraethylorthosilicate (TEOS).

The contact patterns 70 may be in contact with the source/drain regions 50 by vertically passing through the lower interlayer insulating layer 65, the stopper layer 63, and the oxide layer 61.

The semiconductor device 100a may further include a middle interlayer insulating layer 80 on the gate patterns 20, the contact patterns 70, the gate spacers 30, and the lower interlayer insulating layer 65, and an upper interlayer insulating layer 85 on the middle interlayer insulating layer 80. The middle interlayer insulating layer 80 may include silicon nitride (SiN), and the upper interlayer insulating layer 85 may include a compound containing oxidized silicon such as tetraethylorthosilicate (TEOS).

Figure 4B:
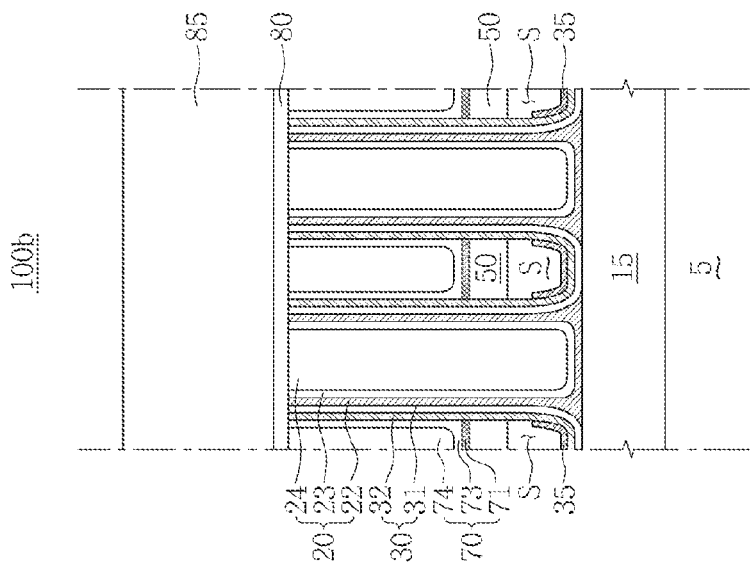

Referring FIGS. 2, 4A, and 4B, a semiconductor device 100b in accordance with example embodiments of the inventive concepts may further include capping spacers 35 on the gate spacers 30 on the isolation regions 15 between the fin active regions 10. The capping spacers 35 may be partially formed on portions of lower portions of the outer spacers 32. The capping spacers 35 may have a U-shaped sectional view or a bowl shape to have a downwardly convex shape or, in other words, an upwardly concave shape facing insides of the isolation regions 15. The capping spacers 35 may include a different material from the outer spacers 32 to have an etch selectivity with respect to the outer spacers 32. The capping spacers may include silicon nitride (SiN). Air spaces S may be formed between the capping spacers 35, on the isolation regions 15 between the fin active regions 10, and the source/drain regions 50.

Referring to FIGS. 2, 5A and 5B, a semiconductor device 100c in accordance with example embodiments of the inventive concepts may include capping spacers 35 formed on the isolation regions 15 between the fin active regions 10. The inner spacers 31 and the outer spacers 32 of the semiconductor device 100a shown in FIGS. 3A and 3B may not extend onto the surface of the isolation regions 15. The surfaces of the isolation regions 15, between the fin active regions 10, and the capping spacers 35 may be directly in contact with each other. The capping spacers 35 may be partially formed on outer walls of lower portions of the outer spacers 32 and the inner spacers 31. The capping spacers 35 may downwardly protrude from the surface of the isolation regions 15. The capping spacers 35 may have a U-shaped sectional view and/or a bowl shape. The capping spacers 35 may include a different material from the isolation regions 15 to have an etch selectivity with respect to the isolation regions 15. The capping spacers 35 may include silicon nitride (SiN). Air spaces S may be formed between the capping spacers 35 on the isolation regions 15 between the fin active regions 10 and the source/drain regions 50.

FIGS. 6A to 6C, through 16A to 16C illustrate longitudinal sectional views for describing a method of fabricating a semiconductor device in accordance with example embodiments of the inventive concepts. FIGS. 6A to 16A illustrate longitudinal sectional views taken along the line I-I' of FIG. 1, FIGS. 6B to 16B illustrate longitudinal sectional views taken along the line II-II' of FIG. 1, and FIGS. 6C to 16C illustrate longitudinal sectional views taken along the line III-III' of FIG. 1.

Figure 6A:
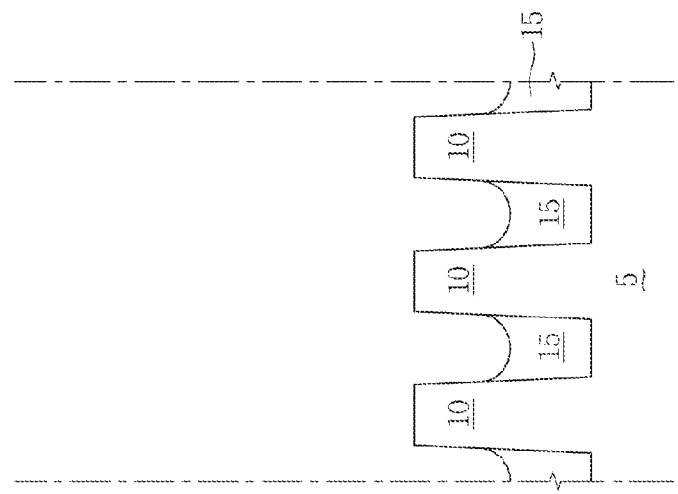
Figure 6B:
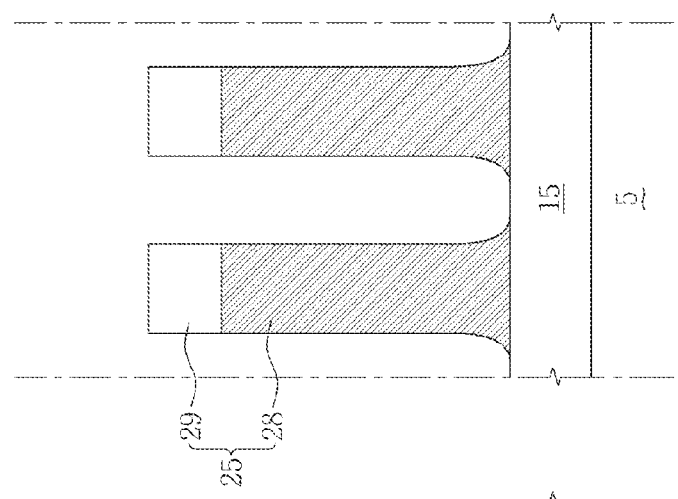
Figure 6C:
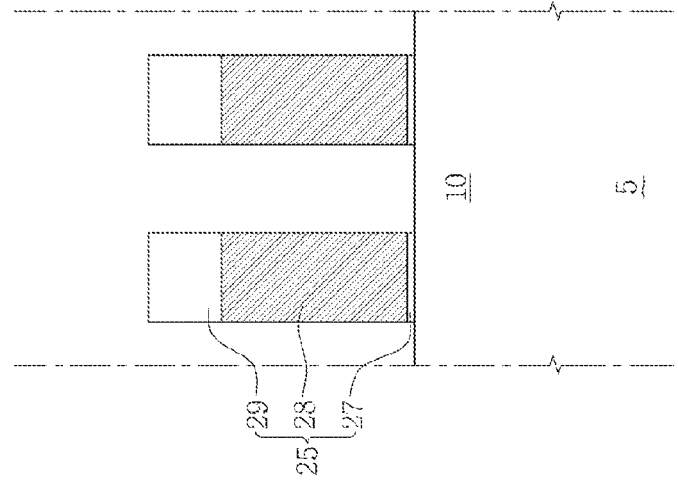

Referring to FIGS. 6A to 6C, a method of fabricating a semiconductor device in accordance with example embodiments of the inventive concepts may include forming fin active regions 10 and isolation regions 15 on a substrate 5, and forming sacrificial gate patterns 25.

The fin active regions 10 may be protrusions of the substrate 5 and extend in parallel with each other. The fin active regions 10 may be a portion of the substrate 5. For example, the fin active regions 10 may be formed by selectively recessing the substrate 5.

The isolation regions 15 may be partially filled between the fin active regions 10. For example, uppermost surfaces of the isolation region 15 may be located at middle portions of the fin active regions 10. Referring to FIG. 6C, the uppermost surfaces of the isolation regions 15 between the fin active regions 10 may be concave. The isolation regions 15 may include an insulating material such as silicon oxide (SiO2). For example, the isolation regions 15 may include an insulating material partially filling recesses between the fin active regions 10.

The sacrificial gate patterns 25 may be formed on the fin active regions 10 and the isolation regions 15 to be in parallel with each other. The sacrificial gate patterns 25 may include sacrificial gate insulating layers 27, sacrificial gate electrodes 28, and sacrificial gate capping layers 29 on the fin active regions 10, and the sacrificial gate electrodes 28 and the sacrificial gate capping layer 29 on the isolation regions 15. Referring to FIG. 6B, the sacrificial gate electrodes 28 on the isolation regions 15 may have a footing shape or a tail shape.

Referring the FIGS. 7A to 7C, the method may include performing a depositing process to form an inner spacer layer 31a, an outer spacer layer 32a, and a capping spacer layer 35a covering the fin active regions 10, the isolation regions 15, and the sacrificial gate patterns 25, and performing a coating process to entirely form a filling insulating layer 40.

The inner spacer layer 31a may include at least one material containing silicon (Si) and nitrogen (N) such as silicon nitride (SiN), silicon carbon nitride (SiCN), silicon oxynitride (SiON), or silicon carbon oxynitride (SiCON). For example, the inner spacer layer 31a may include silicon nitride (SiN). The inner spacer layer 31a may include the same material as the gate capping layer 29.

The outer spacer layer 32a may include an insulating material containing silicon (Si) and carbon (C) such as silicon carbide (SiC), silicon carbon nitride (SiCN), silicon carbon oxide (SiCO), or silicon carbon oxynitride (SiCON). For example, the outer spacer layer 32a may include silicon carbon oxynitride (SiCON).

The capping spacer layer 35a may include an insulating material containing silicon (Si) and nitrogen (N) such as silicon nitride (SiN), silicon carbon nitride (SiCN), silicon oxynitride (SiON), or silicon carbon oxynitride (SiCON). For example, the capping spacer layer 35a may include silicon nitride (SiN).

The filling insulating layer 40 may have an etch selectivity with respect to the capping spacer layer 35a. The filling insulating layer 40 may include at least one of SOH (spin on hardmask), SOD (spin on dielectric), SOG (spin on glass), and USG (undoped silicate) having excellent filling characteristics, a polymeric resin (e.g., a photoresist, or a BARC (bottom anti-reflective coating), or a silazane type flowable oxide (e.g., TOSZ (tonen silazane)). For example, the filling insulating layer 40 may include a silazane material.

Referring to FIGS. 8A to 8C, the method may include performing a first heating process to cure the filling insulating layer 40 and performing a depositing process (i.e., CVD) to form a buffer insulating layer 45 on the filling insulating layer 40.

For example, the first heating process may include annealing or baking the filling insulating layer 40 in an atmosphere having hydrogen ($H_2$), oxygen ($O_2$), or water ($H_2O$) vapor at about 400° C. By this process, a volume of the filling insulating layer 40 may be reduced.

The buffer insulating layer 45 may include an insulating layer, such as TEOS, which is denser than the filling insulating layer 40.

Referring to FIGS. 9A to 9C, the method may include performing a CMP process to remove the buffer insulating layer 45 and planarize the filling insulating layer 40 by removing the buffer insulating layer 45 and partially removing the filling insulating layer 40. By this process, the capping spacer layer 35a may be exposed.

Referring FIGS. 10A to 10C, the method may include performing an etch-back process to partially remove an upper portion of the filling insulating layer 40. By this process, the filling insulating layer 40 on the fin active regions 10 may be completely or partially removed and the filling insulating layer 40 on the isolation region 15 may remain.

The method may include performing a second heating process to further cure the filling insulating layer 40. For example, the second heating process may include annealing or baking the filling insulating layer 40 in an atmosphere having hydrogen ($H_2$), oxygen ($O_2$), or water ($H_2O$) vapor at about 650° C. The second heating process may be performed at higher temperature than the first heating process. By this process, the volume of the filling insulating layer 40 may be further reduced.

In other example embodiments of the inventive concepts, when the filling insulating layer 40 includes a material (i.e., SOH (spin-on-hard mask)) having a sufficient etch selectivity and/or hardness or density with respect to the capping spacer layer 35a, a method of fabricating a semiconductor device in accordance with other example embodiments of the inventive concepts may include selectively performing or omitting the performing of the first heating process, forming the buffer insulating layer 45, performing the CMP process, and/or performing the second heating process described with reference with FIGS. 6A to 10C.

Referring to FIGS. 11 A to 11C, the method may include etching the capping spacer layer 35a, the outer spacer layer 32a, and the inner spacer layer 31a to form gate spacers 30 having outer spacers 32, and inner spacers 31, and capping spacers 35, etching the fin active regions 10 between the sacrificial gate patterns 25 to form recessed regions R. The capping spacers 35 may be formed on the gate spacers 30 on the isolation regions 15. The filling insulating layer 40 may remain on the capping spacers 35. The capping spacers 35 may be formed by removing exposed portions of the capping spacer layer 35a. The capping spacers 35 on the isolation regions 15 may have a U-shaped sectional view and/or a bowl shape. The capping spacers 35 may include silicon nitride (SiN). Air spaces S may be formed between the capping spacers 35 on the isolation regions 15, between the fin active regions 10, and source/drain regions 50 to be described below. During this process, upper corner portions of the sacrificial gate capping layer 29 may be etched and rounded.

Referring to FIGS. 12A to 12C, the method may include performing a strip process to remove the filling insulating layer 40 and the capping spacers 35, and performing an epitaxial growing process to form source/drain regions 50 in the recessed regions R. The strip process may include a wet process. The source/drain regions 50 may include dopants implanted by an ion implantation process performed at the same time as the epitaxial growing process or sequentially performed therewith. The dopants may include at least one of phosphorous (P), arsenic (As), or boron (B). Accordingly, the source/drain regions 50 may include at least one of doped-Si, doped-SiC, or doped-SiGe.

Referring to FIG. 12C, the source/drain regions 50 may be connected with each other in a bridge shape. Air spaces S may be formed between the source/drain regions 50 and the uppermost surfaces of the isolation regions 15.

Referring to FIGS. 13A to 13C, the method may include forming an oxide layer 61, a stopper layer 63, and a lower interlayer insulating layer 65, and performing a CMP process to remove an upper portion of the lower interlayer insulating layer 65 to expose the sacrificial gate capping layer 29. The oxide layer 61 may be formed on the source/drain regions 50. For example, the oxide layer 61 may include native oxides formed on the source/drain regions 50. The stopper layer 63 may be conformally, entirely formed. The stopper layer 63 may include silicon nitride (SiN). The lower interlayer insulating layer 65 may include a compound containing oxidized silicon such as TEOS.

Figure 14A:
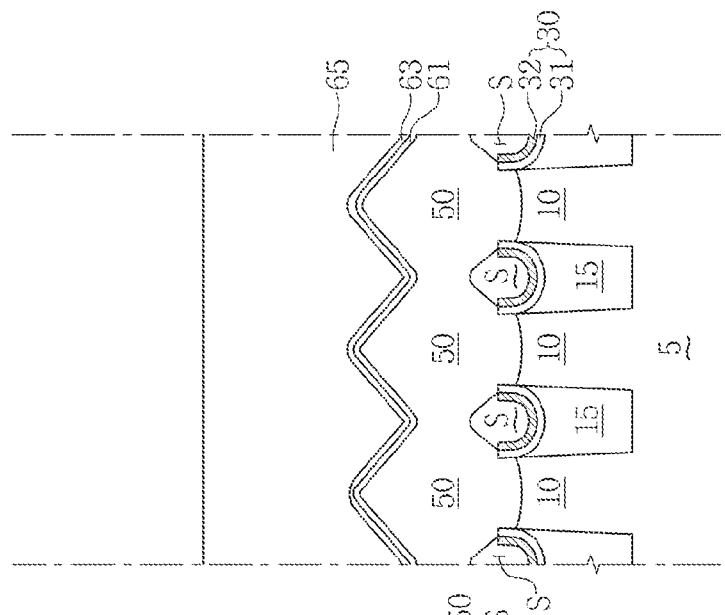
Figure 14B:
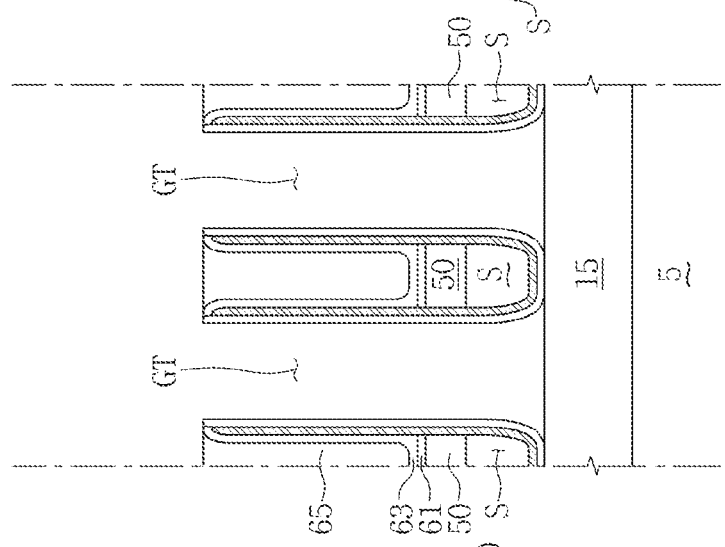
Figure 14C:
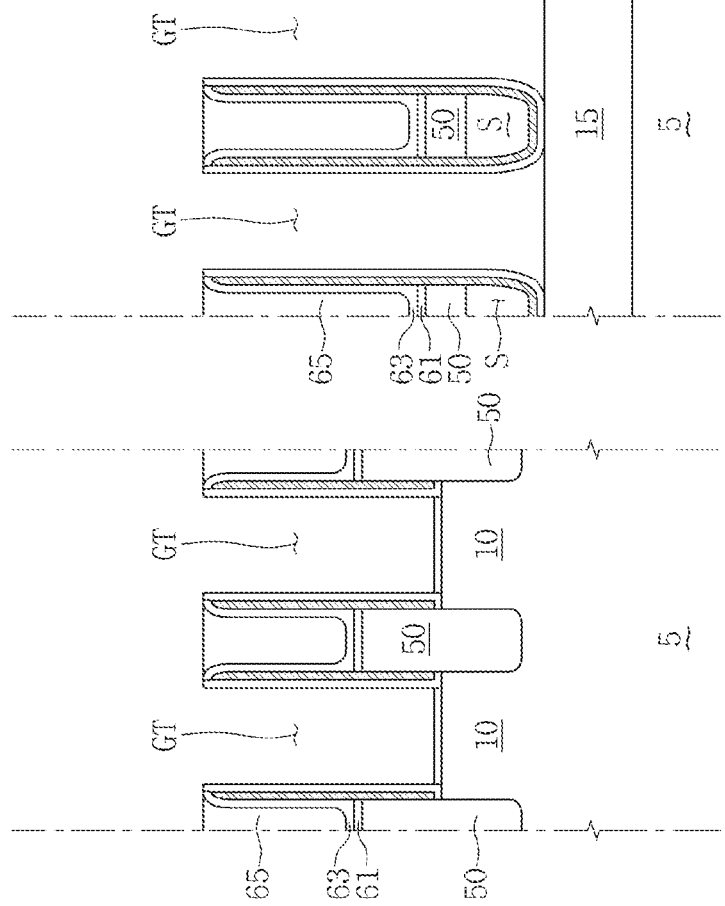

Referring to FIGS. 14A to 14C, the method may include removing the sacrificial gate capping layers 29, the sacrificial gate electrodes 28, and the sacrificial gate insulating layers 27 to form gate trenches GT. Uppermost surfaces of the fin active regions 10 and the isolation regions 15 may be exposed in the gate trenches GT.

Referring to FIGS. 15A to 15C, the method may include forming gate patterns 20 in the gate trenches GT. The gate patterns 20 may include interface insulating layers 21 on the fin active regions 10, gate insulating layers 22 and gate barrier layers 23 having U-shaped sectional views, and gate electrodes 24. The interface insulating layers 21 may include a compound containing oxidized silicon. For example, the interface insulating layers 21 may be formed by an oxidizing process or a naturally (natively) oxidizing process to oxidize the surfaces of the fin active regions 10. The gate insulating layers 22 may include a metal oxide (e.g., hafnium oxide (HfO) or aluminum oxide (AlO)) having permittivity higher than silicon oxide formed by performing a depositing process. The gate barrier layers 23 may include at least one of titanium (Ti), titanium nitride (TiN), tantalum (Ta), tantalum nitride (TaN), and another barrier metal formed by performing a depositing process. The gate electrodes 24 may include at least one of tungsten (W), copper (Cu), titanium (Ti), and another metal or metal compound formed by performing a depositing process or a plating process. The method may include performing a CMP process to remove and planarize upper surfaces of the gate insulating layers 22, the gate barrier layers 23, and the gate electrodes 24.

Referring to FIGS. 16A to 16C, the method may include removing the lower interlayer insulating layer 65 on the source/drain regions 50 between the gate patterns 20 to form contact patterns 70. The contact patterns 70 may include silicide layers 71 on the source/drain regions 50, contact barrier layers 73 having a U-shaped cross sectional view, and contact plugs 74. The silicide layers 71 may include at least one of tungsten silicide (WSi), nickel silicide (NiSi), titanium silicide (TiSi), cobalt silicide (CoSi), or another metal silicide formed by performing a silicidation process. The contact barrier layers 73 may include at least one of titanium (Ti), titanium nitride (TiN), tantalum (Ta), tantalum nitride (TaN), or another barrier metal formed by performing a deposition process. The contact plugs 74 may include at least one of tungsten (W), copper (Cu), titanium (Ti), or another metal or metal compound formed by a deposition process or a plating process.

Then, referring to FIGS. 1, 2, 3A and 3B, the method may include performing a CMP process to planarize upper surfaces of the contact patterns 70, entirely forming a middle interlayer insulating layer 80, and forming an upper interlayer insulating layer 85 on the middle interlayer insulating layer 80. The middle interlayer insulating layer 80 may include silicon nitride (SiN) formed by performing a depositing process. The upper interlayer insulating layer 85 may include a compound containing oxidized silicon such as TEOS.

FIGS. 17A to 17C illustrate longitudinal sectional views for describing a method for fabricating a semiconductor device in accordance with example embodiments of the inventive concepts. FIG. 17A illustrates a longitudinal sectional view taken along line I-I' of FIG. 1, FIG. 17B illustrates a longitudinal sectional view taken along line II-II' of FIG. 1, and FIG. 17C illustrates a longitudinal sectional view taken along line III-III' of FIG. 1. Referring to FIGS. 17A to 17C, a method for fabricating a semiconductor device in accordance with example embodiments of the inventive concepts may include performing a strip process in which the filling insulating layer 40 is removed and the capping spacers 35 remain after performing the processes described with reference with FIGS. 6A to 11C. Then, the method may include performing the processes described with reference with FIGS. 12A to 16C, and 3A and 3B to form the semiconductor device 100b shown in FIGS. 2, 4A, and 4B.

FIGS. 18A to 18C through 25A to 25C illustrate longitudinal sectional views for describing a method for fabricating a semiconductor device in accordance with example embodiments of the inventive concepts. FIGS. 18A to 25A illustrate longitudinal sectional views taken along line I-I' of FIG. 1, FIGS. 18B to 25B illustrate longitudinal sectional views taken along line II-II' of FIG. 1, and FIG. 18C to 25C illustrate longitudinal sectional views taken along line III-III' of FIG. 1.

Figure 18A:
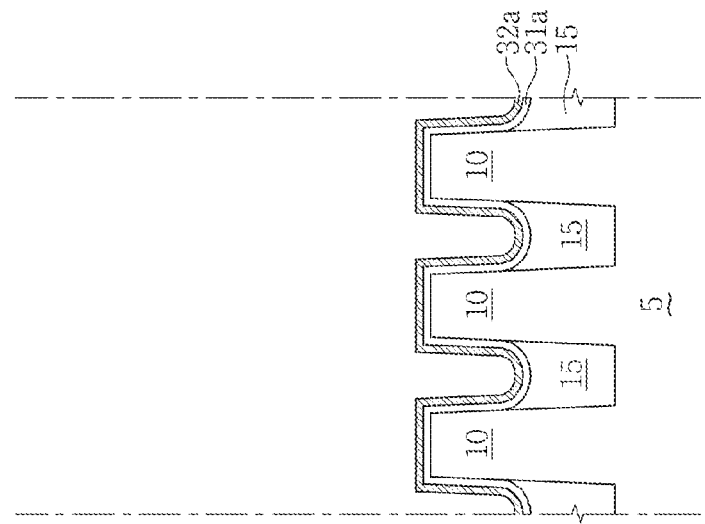
Figure 18B:
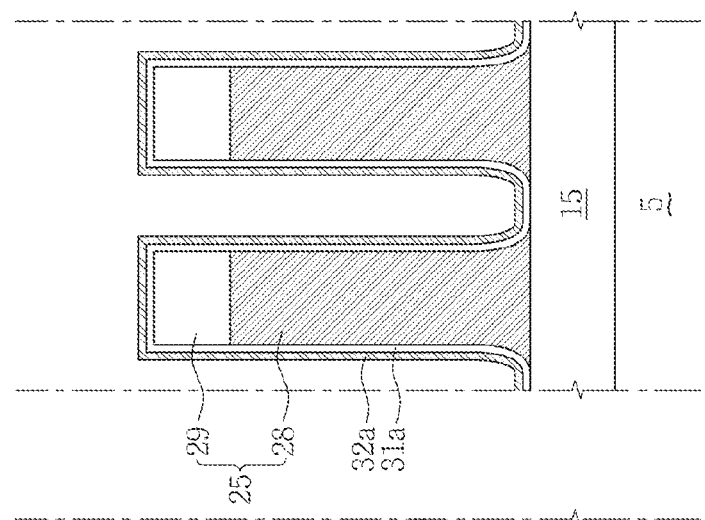
Figure 18C:
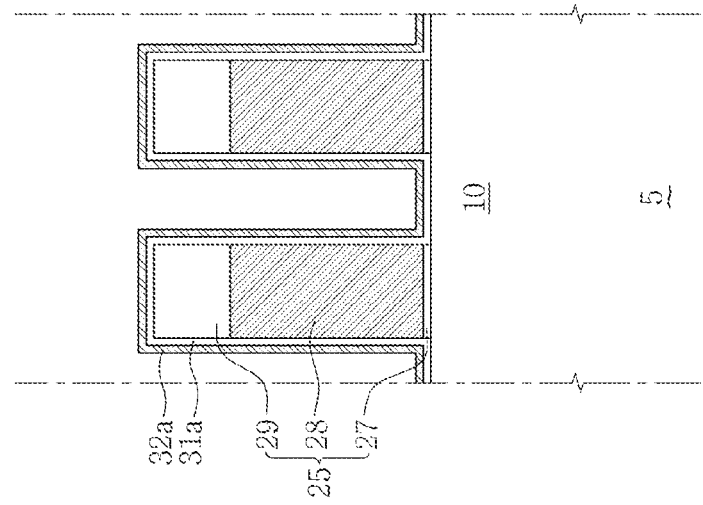

Referring to FIGS. 18A to 18C, a method for fabricating a semiconductor device in accordance with example embodiments of the inventive concepts may include performing the processes described with reference with FIGS. 4A to 7C to form fin active regions 10 and isolation regions 15 on a substrate 5, form sacrificial gate patterns 25 on the fin active regions 10 and the isolation regions 15, and form an inner spacer layer 31a and an outer spacer layer 32a covering the fin active regions 10, the isolation regions 15, and the sacrificial gate patterns 25.

Referring to FIGS. 19A to 19C, the method may include etching the outer spacer layer 32a and the inner spacer layer 31a to form gate spacers 30 having outer spacers 32 and inner spacers 31, and etching the fin active regions 10 between the sacrificial gate patterns 25 to form recessed regions R. Concave bowls C may be formed on uppermost surfaces of the isolation regions 15 between the fin active regions 10.

Referring to FIGS. 20A to 20C, the method may include entirely conformally forming a capping spacer layer 35a. The capping spacer layer 35a may be formed on surfaces of the recessed regions R of the fin active regions 10, surfaces of the concave bowls C of the exposed isolation regions 15, the outer spacers 32, the exposed inner spacers 31, and exposed sacrificial gate capping layers 29.

Referring to FIGS. 21A to 21C, the method may include performing a coating process or a depositing process to entirely form a filling insulating material 40, and performing an etching process to partially remove an upper portion of the filling insulating material 40. The filling insulating material 40 on the fin active regions 10 may be completely or partially removed and the filling insulating material 40 on the isolation regions 15 may remain.

Referring to FIGS. 22A to 22C, the method may include performing an etching process to remove exposed portions of the capping spacer layer 35a. During the process, the surfaces of the recessed regions R of the fin active regions 10 may be exposed and the capping spacer layer 35a may remain only below the filling insulating material 40.

Referring to FIGS. 23A to 23C, the method may include performing a strip process to remove the remaining filling insulating material 40. The capping spacer layer 35a below the filling insulating material 40 may be exposed.

Referring to FIGS. 24A to 24C, the method may include performing the processes described with reference with FIGS. 12A to 13C to form source/drain regions 50 in the recessed regions 50, an oxide layer 61 on the source/drain regions 50, a stopper layer 63 entirely, and a lower interlayer insulating layer 65, and performing a CMP process to expose the sacrificial gate capping layers 29.

Referring to FIGS. 25A to 25C, the method may include, by performing the processes described with reference with FIGS. 14A to 16C, removing the sacrificial gate capping layers 29, sacrificial gate electrodes 28, and sacrificial gate insulating layers 27 to form gate trenches (GT shown in FIGS. 14A and 14B), forming gate patterns 20 in the gate trenches GT, and removing the lower interlayer insulating layer 65 on the source/drain regions 50 between the gate patterns 20, the stopper layer 63, and the oxide layer 61 to form contact patterns 70. The gate patterns 20 may include interface insulating layers 21, gate insulating layers 22, gate barrier layers 23, and gate electrodes 24. The contact patterns 70 may include silicide layers 71, contact barrier layers 73, and contact plugs 74.

Then, referring to FIGS. 2, 15A, and 15B, the method may include performing a CMP process to planarize upper surfaces of the contact patterns 70, forming a middle interlayer insulating layer 80, and forming an upper interlayer insulating layer 85 on the middle interlayer insulating layer 80.

Figure 26A:
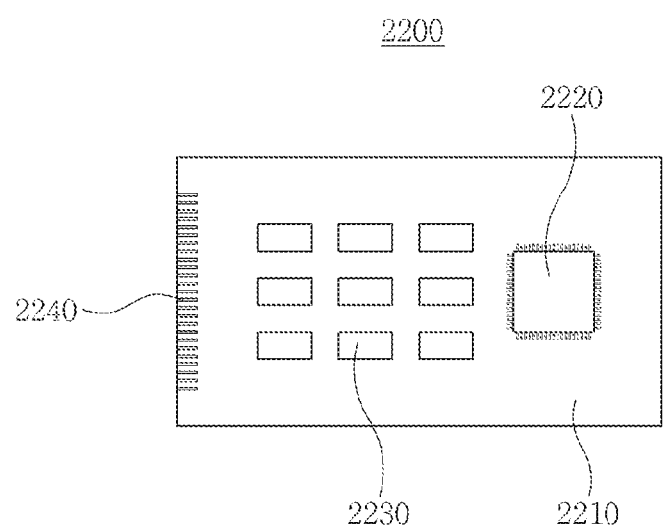
FIG. 26A illustrates a diagram conceptually showing a semiconductor module in accordance with example embodiments of the inventive concepts.

FIG. 26A illustrates a diagram conceptually showing a semiconductor module 2200 in accordance with example embodiments of the inventive concepts. Referring to FIG. 26A, the semiconductor module 2200 in accordance with example embodiments of the inventive concepts may include a processor 2220 mounted on a module substrate 2210, and semiconductor devices 2230. The processor 2220 or the semiconductor devices 2230 may include at least one of the semiconductor devices 100a-100c in accordance with various example embodiments of the inventive concepts. Conductive input/output terminals 2240 may be disposed on at least one side of the module substrate 2210.

Figure 26B:
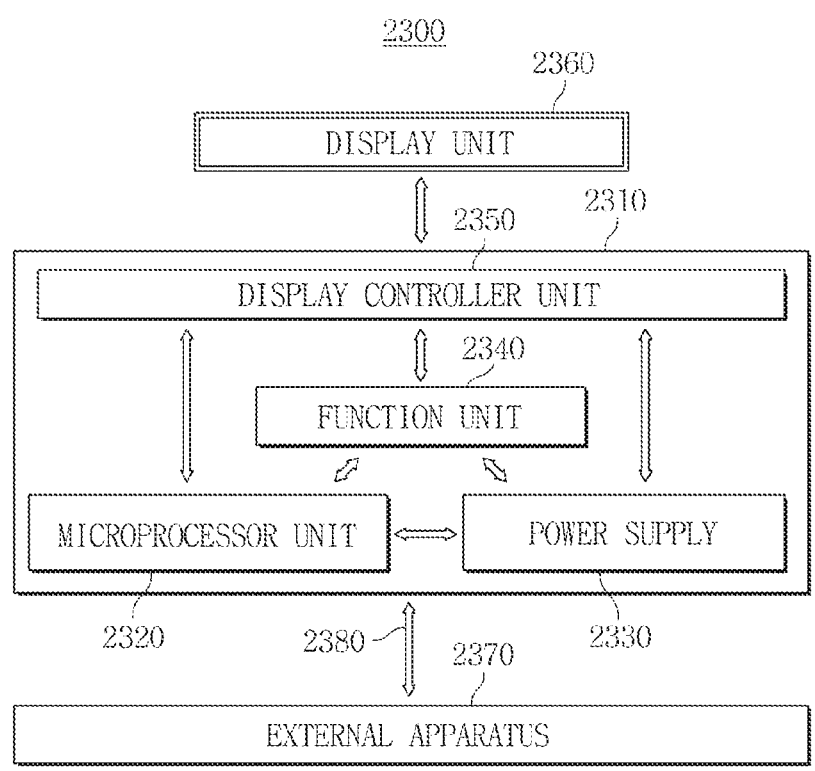
FIGS. 26B and 26C are block diagrams conceptually showing electronic systems in accordance with example embodiments of the inventive concepts.

FIG. 26B illustrates a block diagram conceptually showing an electronic system 2300 in accordance with example embodiments of the inventive concepts. Referring to FIG. 26B, the electronic system 2300 in accordance with example embodiments of the inventive concepts may include a body 2310, a display unit 2360, and an external apparatus 2370. The body 2310 may include a microprocessor unit 2320, a power supply 2330, a function unit 2340, and/or a display controller unit 2350. The body 2310 may include a system board or motherboard including a PCB and/or a case. The microprocessor unit 2320, the power supply 2330, the function unit 2340, and the display controller unit 2350 may be mounted or disposed on an upper surface or an inside of the body 2310. The display unit 2360 may be disposed on the upper surface of the body 2310 or inside/outside of the body 2310. The display unit 2360 may display an image processed by the display controller unit 2350. For example, the display unit 2360 may include a liquid crystal display (LCD), an active matrix organic light emitting diode (AMOLED), or various display panels. The display unit 2360 may include a touch screen. Accordingly, the display unit 2360 may include an input/output function. The power supply 2330 may supply a current or voltage to the microprocessor unit 2320, the function unit 2340, the display controller unit 2350, etc. The power supply 2330 may include a rechargeable battery, a socket for the battery, or a voltage/current converter. The microprocessor unit 2320 may receive a voltage from the power supply 2330 to control the function unit 2340 and the display unit 2360. For example, the microprocessor unit 2320 may include a CPU or an application processor (AP). The function unit 2340 may include a touch-pad, a touch-screen, a volatile/nonvolatile memory, a memory card controller, a camera, a lighting, an audio and video playback processor, a wireless transmission/reception antenna, a speaker, a microphone, a USB port, and other units having various functions. The microprocessor unit 2320 or the function unit 2340 may include at least one of the semiconductor devices 100a-100c in accordance with various example embodiments of the inventive concepts.

Figure 26C:
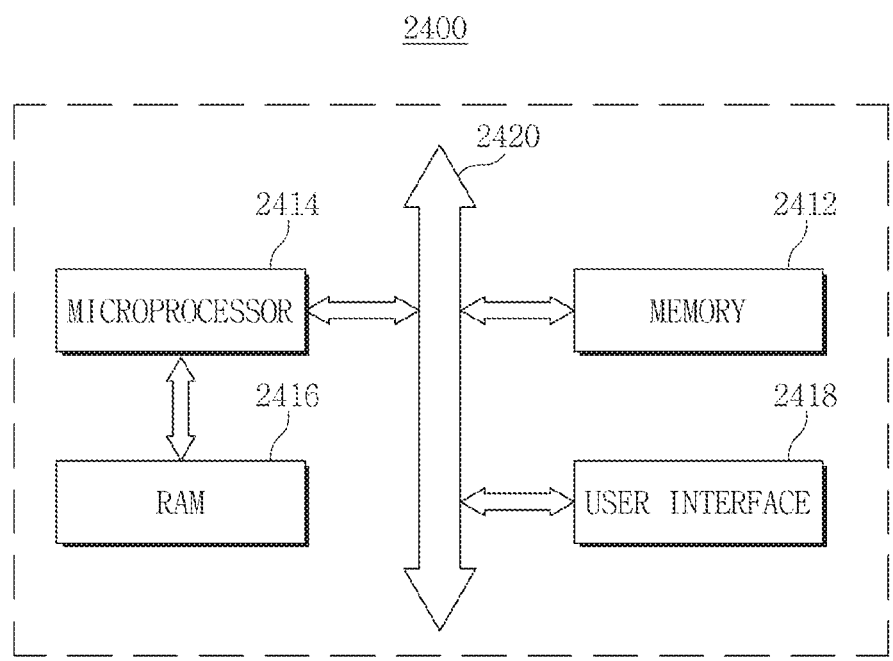

FIG. 26C illustrates a block diagram conceptually showing an electronic system 2400 in accordance with example embodiments of the inventive concepts. Referring to FIG. 26C, the electronic system 2400 in accordance with example embodiments of the inventive concepts may include a microprocessor 2414, a memory 2412, and a user interface 2418 which perform data communication using a bus 2420. The microprocessor 2414 may include a CPU or an AP. The electronic system 2400 may further include a random access memory (RAM) 2416 which directly communicates with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a lighting, or various other input/output devices. The memory 2412 may store codes for operating the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include at least one of the semiconductor devices 100a-100c in accordance with various example embodiments of the inventive concepts.

Semiconductor devices in accordance with various example embodiments of the inventive concepts include blocking patterns formed on isolation regions. Accordingly, electrical shorts between source/drain regions and gate patterns can be prevented or reduced.

Further, gate insulating layers and lower portions of gate electrodes do not have pin holes and/or sharp points on the isolation regions. Accordingly, electrical malfunction, leakage current, and power consumption of the semiconductor devices can be reduced.

Although a few example embodiments have been described, those skilled in the art will readily appreciate that many modifications are possible without materially departing from the novel teachings and advantages. Accordingly, all such modifications are intended to be included within the scope of this inventive concepts as defined in the claims.

What is claimed is:

1. A semiconductor device comprising:
    a fin active region protruding from a substrate and an isolation region defining the fin active region;
    a gate pattern intersecting the fin active region and the isolation region;
    a gate spacer formed on a side surface of the gate pattern and configured to extend onto a surface of the isolation region; and
    a source/drain region including a portion protruding, from the fin active region adjacent to the gate pattern, the portion of the source/drain region extending in a horizontal direction,
    wherein the gate spacer on the isolation region and the portion of the source/drain region define an air space therebetween.

2. The semiconductor device of claim 1, wherein
    the gate spacer comprises an inner spacer having an etch selectivity with respect to the isolation region and an outer spacer having an etch selectivity with respect to the isolation region and the inner spacer, and
    a portion of the outer spacer on the isolation region is between the air space and the inner spacer.

3. The semiconductor device of claim 1, wherein the air space is spaced apart from the isolation region.

4. The semiconductor device of claim 1, wherein the gate spacer on the isolation region has a U-shaped sectional view.

5. The semiconductor device of claim 1, further comprising:
    a capping spacer formed on the gate spacer on the isolation region,
    wherein the capping spacer is not formed on a top surface of the source/drain region.

6. The semiconductor device of claim 1, wherein the gate pattern on the fin active region comprises:
    an interface insulating layer formed directly on the fin active region;
    a gate insulating layer formed on the interface insulating layer;
    a gate barrier layer formed on the gate insulating layer; and
    a gate electrode formed on the gate barrier layer.

7. The semiconductor device of claim 1, wherein the gate pattern on the isolation region comprises:
    a gate insulating layer formed directly on the isolation region;
    a gate barrier layer formed on the gate insulating layer; and
    a gate electrode formed on the gate barrier layer.

8. A semiconductor device comprising:
    isolation regions defining fin active regions;
    gate patterns formed on the fin active regions and the isolation regions; and
    gate spacers formed on side walls of the gate patterns,
    wherein the gate spacers extend onto the isolation regions between the fin active regions and each of the gate spacers has U-shaped sectional views.

9. The semiconductor device of claim 8, wherein the gate spacers comprise:
    inner spacers contacting the gate patterns and the isolation regions and including silicon nitride; and
    outer spacers including carbon to have an etch selectivity with respect to the inner spacers.

10. The semiconductor device of claim 8, wherein each of the gate patterns comprises:

a gate insulating layer formed directly on the isolation region;

a gate barrier layer formed on the gate insulating layer; and a gate electrode formed on the gate barrier layer.

11. The semiconductor device of claim 10, wherein each of the gate patterns further comprises an interface insulating layer between the fin active region and the gate insulating layer.

12. The semiconductor device of claim 8, further comprising:

source/drain regions protruding from insides of the fin active regions between the gate patterns; and contact patterns formed on the source/drain regions, wherein the source/drain regions are connected with each other in a bridge shape, wherein each of the contact patterns comprises a silicide layer formed on the source/drain region, a contact barrier layer formed on the silicide layer, and a contact plug formed on the contact barrier layer.

13. The semiconductor device of claim 8, wherein the gate spacers on the isolation regions between the fin active regions completely cover the isolation regions between the fin active regions.

14. A semiconductor device comprising:

fin active regions extending in a first direction and isolation regions formed between the fin active regions;

gate patterns extending in a second direction perpendicular to the first direction to intersect the fin active regions and the isolation regions;

capping spacers on the isolation regions between the gate patterns;

gale spacers on sidewalls of the gate patterns; and source/drain regions formed in the fin active regions between the gate patterns, wherein the gate spacers cover the isolation regions between the gate patterns.

15. The semiconductor device of claim 14, wherein the gate spacers formed on facing sidewalls of adjacent gate patterns are integrated to be materially contiguous.

16. The semiconductor device of claim 15, wherein the gate spacers comprises:

inner spacers directly formed on the sidewalls of the gate patterns; and outer spacers formed on outer sidewalls of the inner spacers, wherein the inner spacers contacting the isolation regions and the source/drain regions.

17. The semiconductor device of claim 14, wherein the capping spacers have concave bowl shapes and are not formed on the sidewalls of the gate patterns.

18. The semiconductor device of claim 14, wherein the gate spacers completely cover the isolation regions between the fin active regions.

19. The semiconductor device of claim 14, wherein the gate spacers on the isolation regions and the source/drain regions define air spaces therebetween, the air spaces being spaced apart from the isolation regions.

* * * * *